(12) United States Patent
Gefter et al.

(10) Patent No.: US 9,084,334 B1
(45) Date of Patent: Jul. 14, 2015

(54) BALANCED BARRIER DISCHARGE NEUTRALIZATION IN VARIABLE PRESSURE ENVIRONMENTS

(71) Applicants: Peter Gefter, South San Francisco, CA (US); Edward Anthony Oldynski, Martinez, CA (US); Steven Bernard Heymann, Los Gatos, CA (US)

(72) Inventors: Peter Gefter, South San Francisco, CA (US); Edward Anthony Oldynski, Martinez, CA (US); Steven Bernard Heymann, Los Gatos, CA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 14/536,983

(22) Filed: Nov. 10, 2014

(51) Int. Cl.
H05F 3/00 (2006.01)
H05F 3/04 (2006.01)
H05F 3/06 (2006.01)

(52) U.S. Cl.
CPC ........................................ H05F 3/06 (2013.01)

(58) Field of Classification Search
USPC ......................................................... 361/213
See application file for complete search history.

(56) References Cited

U.S. PATENT DOCUMENTS

| 5,492,862 | A | 2/1996 | Misumi | 438/516 |
| 5,596,478 | A | 1/1997 | Ohmi et al. | 361/212 |
| 5,930,105 | A | * 7/1999 | Pitel et al. | 361/212 |
| 6,465,795 | B1 | 10/2002 | Madonado et al. | 250/492.2 |
| 7,670,433 | B2 | 3/2010 | Hayashi et al. | 118/718 |
| 2006/0279897 | A1 | 12/2006 | Mizuno et al. | 361/220 |
| 2007/0134426 | A1 | 6/2007 | Hayashi et al. | 427/398.1 |
| 2010/0307414 | A1* | 12/2010 | Yokoi et al. | 118/712 |
| 2014/0054470 | A1* | 2/2014 | Gorczyca et al. | 250/424 |
| 2014/0293496 | A1* | 10/2014 | Oldynski et al. | 361/213 |

OTHER PUBLICATIONS

Phil Danielson, "A Journal of From Practical and Useful Vacuum Technology (Contamination in Vacuum Systems: Sources and Remedies)", *R&D Magazine*, May 2001.

(Continued)

*Primary Examiner* — Dharti Patel
(74) *Attorney, Agent, or Firm* — The Patent Source

(57) ABSTRACT

Methods and apparatus for static charge neutralization in variable pressure environments are disclosed. In particular, barrier discharge ionization apparatus may include a hollow dielectric channel disposed within a variable pressure environment and may have at least one open end, a reference emitter disposed on the outer surface of the channel, and a high voltage electrode disposed within the channel. The high voltage electrode may present a high intensity electric field to the reference emitter through the dielectric channel in response to the provision of a variable-waveform signal dictated by conditions in the variable pressure environment. This results in the generation of a plasma region with electrically balanced charge carriers within the variable pressure environment due to barrier discharge occurring at the interface of the reference emitter and the outer surface of the dielectric channel. The disclosed apparatus are compatible with either radio frequency or micro-pulse voltage power supplies.

20 Claims, 19 Drawing Sheets

(56) References Cited

OTHER PUBLICATIONS

Gabriela Neagoe, "Surface Treatment of Polypropylene Textile by Underwater Discharge", Doctoral Thesis of Gabriela Neagoe, Masaryk University, 2011, pp. 15-23.

H. Inaba et al., "Neutralization of Static Electricity by Soft X-rays and Vacuum UV Radiation", Journal of Electrostatics 33 (1994), pp. 15-42.

Hamamatsu PhotoIonizer Catalog, pp. 1-14, Jun. 0124.

Hamamatsu product data sheet, "H2D2 Light Source Unit", four pages, Mar. 2014.

Takasago Thermal Engineering Co., excerpts of product catalog, IRSYS-SX, ISX-224(Soft X-Ray Irradiation Static Eliminator), IRSYS-SX (Soft X-Ray Irradiation Neutralization System) and IRSYS-UV (Vacuum Ultra Violet Irradiation Neutralization System), date unknown, admitted prior art.

Yuri P. Raize, "Gas Discharge Physics", hardcover book published by Springer, Corrected edition (Sep. 19, 1991), pp. 132-139.

Author Unknown, "Dust Removal From Solar Cells", Nasa Tech Briefs, Sep. 2014, two pages.

* cited by examiner

BALANCED BARRIER DISCHARGE NEUTRALIZATION IN VARIABLE PRESSURE ENVIRONMENTS

BACKGROUND OF THE INVENTION

1. Field of the Invention

The present invention is directed to balanced ionization for static charge neutralization by barrier discharge. Accordingly, the general objects of the invention are to provide novel systems, methods, and apparatus of such character.

2. Description of the Related Art

A significant portion of present semiconductor manufacturing begins with the creation of wafers that are then processed in various ways in a low-pressure/vacuum environment. Such processing may include thin film material deposition, etching, spattering, plasma treatment, and/or other operations running at middle or deep vacuum (i.e., low pressure). In this context middle or deep vacuum pressure is typically between about $10^{-2}$ Torr to about $10^{-3}$ Torr.

One new trend in semiconductor manufacturing is a transition away from wafer-based manufacturing and to continuous roll to roll manufacturing. Roll to roll semiconductor manufacturing generally entails printing electronic circuits (for example by vacuum metallization) on a suitable thin plastic film as it is unwound from one spool and then wound onto another. Micron and submicron printed electronic circuits are possible using roll to roll manufacturing, but commercially viable implementations must strictly comply with semiconductor quality control requirements that have applied to wafer-based manufacturing. In particular, the resulting work product must be virtually defect-free, uniform, and clean.

The unavoidable generation of electrostatic charges in middle and low pressure roll to roll semiconductor manufacturing environments presents significant problems. These include (1) electrostatic adhesion of the thin film due to handling and/or guiding devices during loading and/or unloading, (2) damaged thin film work product due to high electrical stresses and discharges, and (3) thin film surface contamination due to adhesion of attracted particulates. These problems are expected to become more acute as semiconductor circuitry dimensions decrease and densities increase. Thus, there is growing interest in electrostatic charge generation, monitoring, and neutralization, especially in low pressure roll to roll semiconductor manufacturing.

Corona-based static charge neutralizers designed to operate at normal atmospheric pressure (typically about 760 Torr) are, of course, well known. However, they are generally considered to be undesirable for use in variable and/or middle to low pressure environments because they are prone to electrical breakdowns, spark discharges, and electrode erosion. For these reasons, other technologies have been adopted for use in low pressure semiconductor manufacturing. For example, plasma neutralizers using magnetron-DC discharge or RF type plasma ion generating sources have been used to shower semiconductor wafers with electron/ion beams during ion implantation and/or etching. Also, photo ionizing neutralizers using soft X-ray and UV light generating lamps are known for neutralizing products at low pressure in the presence of inert and electro-positive gases like N2 and Ar. However, the efficiency of photo ionizing neutralizers is known to dramatically decrease at N2 and O2 gas pressures in the range $10^{-1}$-$10^{-2}$ Torr. Finally, UV deuterium lamp neutralizers may provide bipolar ionization and static charge reduction on wafers at reduced pressure down to $10^{-3}$-$10^{-5}$ Torr. Such neutralizers suffer from a number of serious deficiencies. These include the fact that UV deuterium arc lamps (1) operate at very high temperatures, (2) require special high voltage power supplies and efficient cooling systems, and (3) produce relatively narrow neutralization beams that operate across small areas.

Accordingly, further improvements in static charge neutralization in thin film and/or wafer semiconductor manufacturing, especially as performed in middle to low vacuum pressure environments, continue to be desirable.

SUMMARY OF THE INVENTION

One aspect of the present invention is directed to a balanced ionizer for static charge neutralization in a variable pressure environment in response to the application of variable-waveform signals thereto. The balanced ionizer may comprise (1) a hollow dielectric channel having a length and an outer surface, the dielectric channel being disposed within the variable pressure environment; (2) a reference emitter helically disposed along the length of and on the outer surface of the dielectric channel, the reference emitter receiving a variable-waveform reference signal dictated by conditions in the variable pressure environment; and (3) a high voltage electrode disposed within the hollow dielectric channel. In accordance with the invention, the high voltage electrode may present a high intensity electric field to the reference emitter through the dielectric channel in response to the provision of a variable-waveform high voltage signal dictated by conditions in the variable pressure environment. That electric field may cause the generation of a plasma region with electrically balanced charge carriers within the variable pressure environment due to barrier discharge occurring at the interface of the reference emitter and the outer surface of the dielectric channel.

In a related aspect, the invention is directed to balanced ionizer for static charge neutralization in an enclosed variable pressure environment in response to the application of at least one variable-waveform signal thereto. The balanced ionizer may comprise a hollow dielectric channel having a length, an inner surface, an outer surface, one open end, and one opposing closed end. The dielectric channel may be disposed within the variable pressure environment such that the open end of the dielectric channel is not within the variable pressure environment, and such that the opposing closed end is within the variable pressure environment. The ionizer may also comprise a reference emitter disposed within the variable pressure environment and along the length of and on the outer surface of the dielectric channel, and the reference emitter may receive a variable-waveform reference signal dictated by conditions in the variable pressure environment. The ionizer may further comprise a high voltage electrode disposed within the hollow dielectric channel. In accordance with this aspect of the invention, the high voltage electrode may present a high intensity electric field to the reference emitter through the dielectric channel in response to the provision of a variable-waveform high voltage signal dictated by conditions in the variable pressure environment. That electric field may cause the generation of a plasma region with electrically balanced charge carriers within the variable pressure environment due to barrier discharge occurring at the interface of the reference emitter and the outer surface of the dielectric channel.

Yet another aspect of the invention is directed to a balanced ionizing bar for static charge neutralization in a variable pressure environment in response to the application of variable-waveform signals thereto. The balanced ionizing bar may comprise an elongated chassis having a open faced hollow interior and a manifold with a gas inlet and plural apertures disposed between the manifold and the hollow interior such that gas entering the manifold inlet flows out of the open face of the hollow interior, wherein the chassis being at least partially disposed within the variable pressure environment. The bar may also comprise a hollow dielectric channel having a length and an outer surface, wherein the dielectric channel may be disposed within the hollow interior of the elongated chassis. The bar further comprise a reference emitter helically disposed along the length of and on the outer surface of the dielectric channel, the reference emitter receiving a variable-waveform reference signal dictated by conditions in the variable pressure environment. Finally, the bar may comprise a high voltage electrode disposed within the hollow dielectric channel. The high voltage electrode may present a high intensity electric field to the reference emitter through the dielectric channel in response to the provision of a variable-waveform high voltage signal dictated by conditions in the variable pressure environment. That electric field may cause the generation of a plasma region with electrically balanced charge carriers within the variable pressure environment due to barrier discharge occurring at the interface of the reference emitter and the outer surface of the dielectric channel.

Numerous other advantages and features of the present invention will become apparent to those of ordinary skill in the art from the following detailed description of the preferred embodiments, from the claims and from the accompanying drawings.

BRIEF DESCRIPTION OF THE DRAWINGS

The preferred embodiments of the present invention will be described below with reference to the accompanying drawings wherein like numerals represent like steps and/or structures and wherein.

DETAILED DESCRIPTION OF THE PREFERRED EMBODIMENTS

Figure 1:
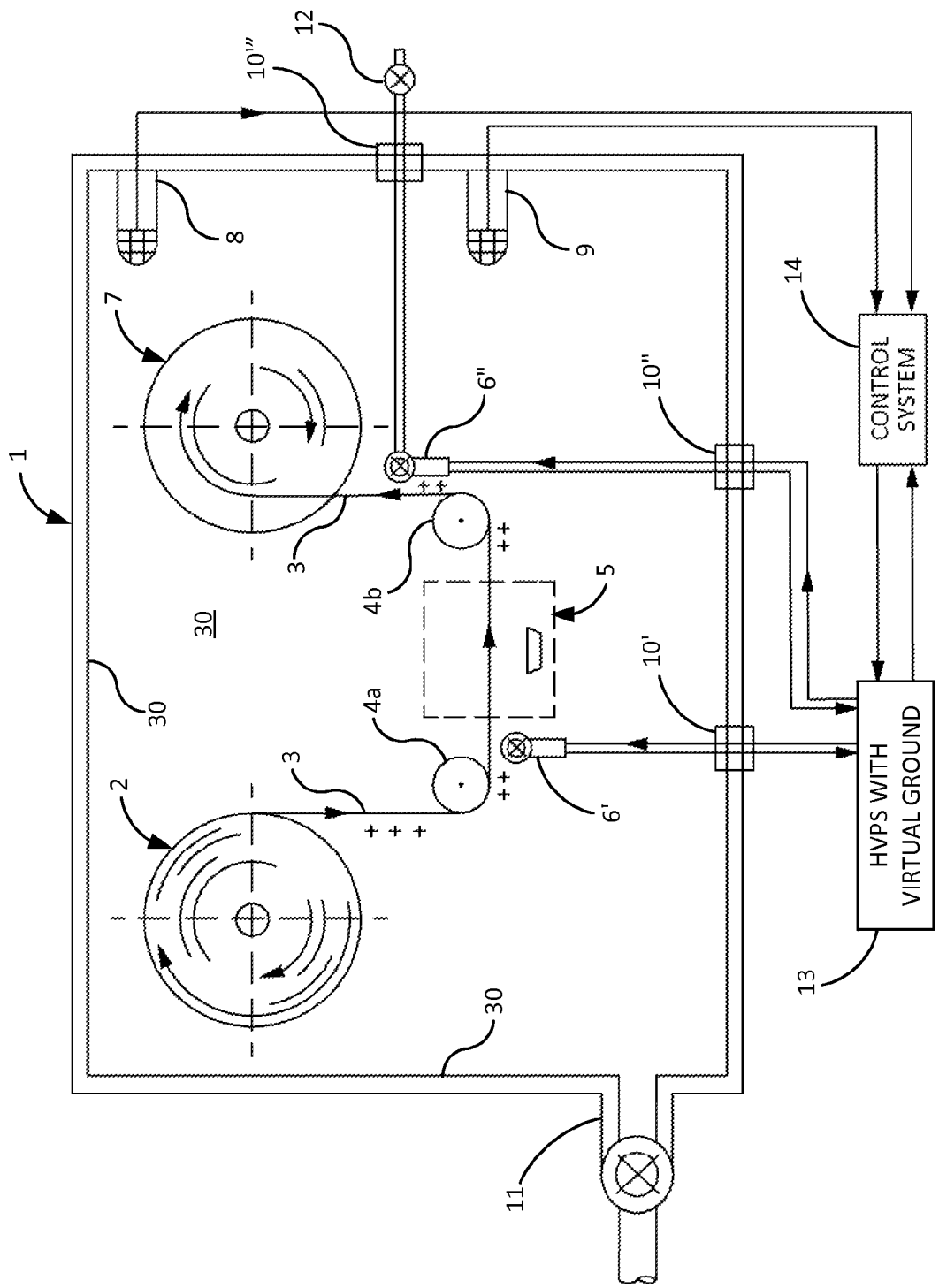
FIG. 1 is a simplified representation of a low pressure/vacuum semiconductor manufacturing chamber equipped with a charge neutralization system with two barrier discharge ionization cells/bars in accordance with the invention.

With reference to FIG. 1, a simplified representation of a middle or low pressure (i.e., deep vacuum) chamber 1 is bounded on all sides by chamber walls 30 and equipped with a barrier discharge neutralizer system in accordance with the present invention. Generally, the neutralizer system comprises ionization cells 6' and 6" electrically linked to a high voltage power supply 13 (which, in turn, is communicatively linked to a control system 14). As is typical, chamber 1 is equipped with process monitoring devices such as a pressure gauge/sensor 8 or/and a residual gas analyzer 9 that are communicatively linked to conventional control system 14 (which, in turn, is communicatively linked to high voltage power supply 13). In this way, environmental condition sensors, such as pressure sensor 8 and/or ozone sensor 40, may sense at least one environmental condition within the environment (e.g., a variable pressure environment), and HVPS 13 may produce variable-waveform high-voltage signal that depends at least in part on a change in an environmental condition sensed by one or more of such sensors. In particular, the amplitude of the variable-waveform high voltage signal can be controlled to be less than the breakdown voltage of the dielectric channel at the pressure of the environment at any particular moment.

As shown, high voltage power supply 13 and control system 14 are, preferably, positioned outside chamber 1 and chamber 1 preferably has several sealed ports 10', 10", 10''', and vacuum pump 11.

Ionization cells 6' and 6" may be connected to a pressure controlled RF or micro-pulse HVPS 13 which presents variable high voltage waveforms/signals (RF/MPBD) to the high voltage electrode. Some non-limiting examples of compatible RF waveforms include sinusoidal, trapezoidal, pulsed, voltage burst, etc. and any of these waveforms may be one or more of amplitude-variable, frequency-variable, duty-factor-variable, etc. By way of non-limiting examples, variable high voltage micro-pulsed signals may basically comprise two asymmetric pulses (one positive component having an amplitude higher than the corresponding negative component and one negative component having an amplitude higher than the corresponding positive component). The duration of each pulse may be in the nano-second range and the signal may have a very small duty factor. Each ionizing (high voltage) asymmetric micro pulse may have at least one polarity pulse with amplitude higher than barrier discharge threshold. Further, both polarity pulses can be arranged in pulse trains comprising ionizing and non-ionizing pulses, and variability may be provided by changing (1) the number of positive and negative pulses per cycle, (2) the duration of each pulse, (3) the amplitude of each pulse, and/or (4) the duty factor of each cycle. Various conventional high voltage power supplies, signals, and/or techniques may be used in conjunction with the invention. For example, radio frequency high voltage power supplies commonly used in the field of ionization and/or neutralization may be used and/or adapted for use with the invention by those of ordinary skill in the art. Further, conventional micro-pulse power supplies may be used and/or adapted for use with the invention as described herein. Examples of such micro-pulse power supplies are provided in the following U.S. patent, the entire contents of which are hereby incorporated by reference: U.S. Pat. No. 8,773,837, to Partridge et al., bearing application Ser. No. 13/367,369, filed on Feb. 6, 2012, issued on Jul. 8, 2014, and entitled "Multi Pulse Linear Ionizer".

In the non-limiting example shown, chamber 1 accommodates rolls 2 and 7 of thin film material (typically a plastic film or web) on which thin films or semiconductor circuits are being created. Ionization cells 6' and 6" are preferably positioned in close proximity to web 3 inside vacuum chamber 1. Roll 2 is carrying a known raw/untreated web or film or web material 3. While a wide variety of well known materials may be used, the material will be generically referred to throughout as a web. Those of ordinary skill will appreciate that the term web is intended to be a non-limiting way to refer to the widest class of materials that may be used.

As shown, web 3 may be unwound from roll 2 and move about a guide roller 4a to a processing area 5. During this process, web 3 may acquire undesirable electrostatic charges of unknown polarities and densities that will be targeted for neutralization by barrier discharge ionization cell 6' in accordance with the invention. Similarly, web 3 may acquire undesirable electrostatic charges due to transformative operations (such as vapor or chemical deposition of metal films and/or other materials) occurring in processing area 5 and/or due to contact with guide roller 4b. Therefore, a second barrier discharge ionization cell 6" may be positioned between roller 4b and intake/winding roll 7 to neutralize any charges (and associated undesirable effects such as particulate adhesion, discharges, sparking, etc.) on web 3 before it is wound onto roll 7. As shown, ionization cell 6" may be electrically connected to a high voltage power supply (HVPS) 13 via insulated conductors passing through chamber wall 30 via a seal 10" and charge neutralization may be assisted with an optional gas supply and/or vacuum line 12 passing through chamber wall 30 via another seal 10"'. Those of skill in the art will recognize that ionization cell 6' may also be electrically connected to high voltage power supply (HVPS) 13 via insulated conductors passing through chamber wall 30 via another seal 10'. Also, ionization cell 6' may be assisted with its own optional gas supply and/or vacuum line.

Figure 2:
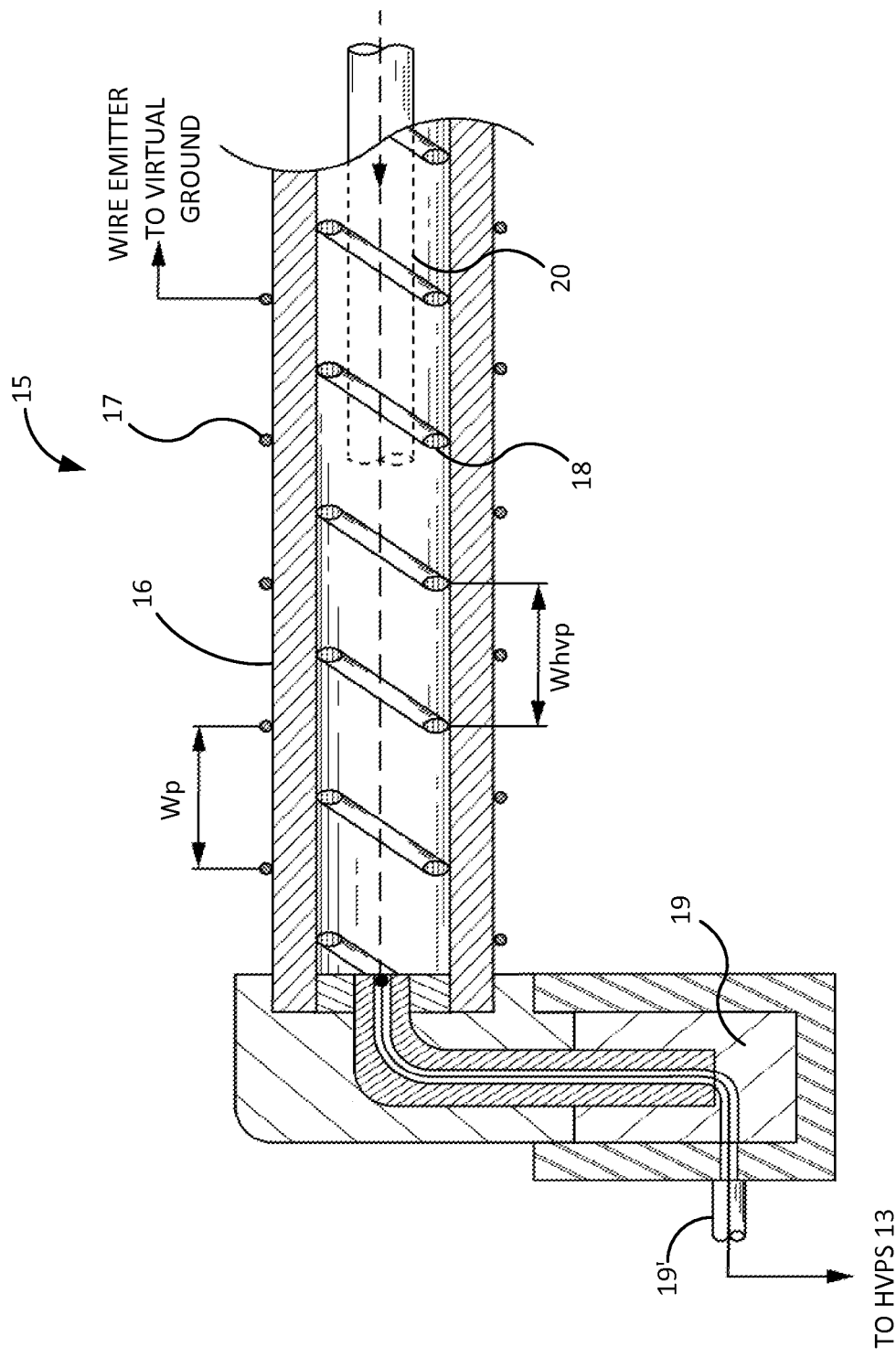
FIG. 2 is a partial cross-sectional view of an ionization cell in accordance with a preferred embodiment of the present invention.
Figure 3:
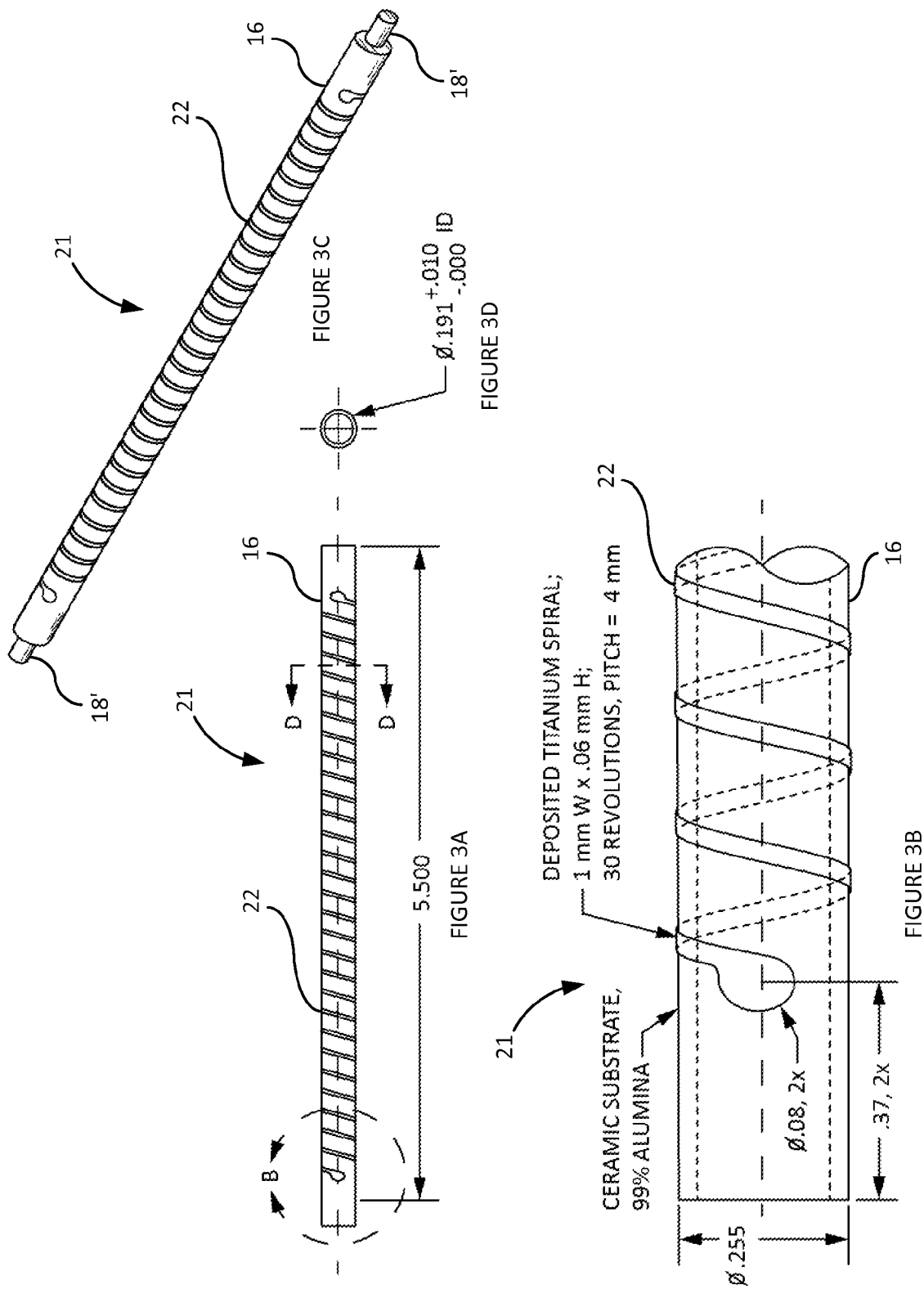
FIGS. 3A-3D are various views of an ionization cell in accordance with a second preferred embodiment of the present invention.

FIG. 2 is a partial cross-sectional view of an ionization cell 15 in accordance with a preferred embodiment of the present invention. This embodiment is configured as an hollow channel, duct, passage, cylinder, or tube 16 (with one open end) formed of a dielectric/non-conductive material having high chemical corrosion resistance, a high dielectric strength (in the range of about 5,000-8,000 V/mm), and a high surface and volume resistivity (in the range of about $10^{14}$-$10^{18}$ Ohms/cm). Conventional materials exhibiting these qualities may include ceramics, fused silica, Pyrex, quartz, Millar, Teflon and other materials known in the art. It has been determined with the invention that surface roughness of the dielectric cylinder 16 may have a significant effect on charge carrier generation efficiency and, thus, may be an important parameter of emitter design optimization.

Ionization cell 15 may also include a helically coiled wire 17 that is preferably wound around a central portion of cylinder 16. Wire 17 serves as an ion/electron emitter when provided a high-voltage ionizing signal as discussed herein. The preferred helical winding configuration that may include open spaces/areas between coils. To optimize ion/electron generation, the pitch $W_p$ of outer emitter coil 17 may be equal to one or more wire diameters.

Outer wire emitter 17 may be formed, for example, of tungsten, titanium, nichrome, or another (conventional or otherwise) alloy having a high thermo and oxidation resistance. Optionally, the surface of wire emitter 17 may be specially treated with an oxidation layer or covered with another material layer by plating. For example, wire 17 formed of titanium may have a surface layer of Titanium oxide to thereby enhance charge carrier generation and emission. Reference emitter 17 may have diameter in the range of about 20 microns to about 150 microns, and the most preferred diameter range is about 60 microns to about 100 microns. Reference emitter 17 is preferably electrically connected to a virtual ground and this ground may or may not be provided by the HVPS 13.

With continuing reference to FIG. 2, ionization cell 15 may also include an inner high voltage electrode 18 that is disposed within cylinder/tube 16 and in electrical communication with high voltage power supply 13. Wire 18 provides and ionizing electric field that causes ionic discharge (barrier charge) from wire 17 when wire 18 is provided with a high-voltage ionizing signal as discussed herein. In particular, the high voltage electric field presented by an energized wire 18 to wire 17 through tube 16, causes barrier discharge at the interface/barrier between wire 17 and the outer surface of tube 16. In a preferred form, inner electrode 18 may be a helically coiled spring disposed on the inner surface of tube 16. Electrode 18 may have a pitch $W_{hvp}$ that is smaller than the pitch $W_p$ of wire emitter 17 and the diameter of inner electrode 18 is preferably larger than that of wire emitter 17. In a most preferred form, electrode 18 may be selectively received within a socket 19, so that electrode 18 may receive a suitable high voltage signal from HVPS 13 via high voltage cable 19' and so that ionization cell 15 is easily exchangeable (easily replaced by removing a cell 15 and replacing it with another cell 15 with no special tools or techniques). The preferred helical winding configuration should include open spaces/areas between coils and to optimize plasma/charge carrier generation. Thus, the pitch $W_{hvp}$ of electrode 18 should be greater than at least one wire diameter. Although operative at normal atmospheric pressure, the open-ended barrier discharge ionization cell of FIG. 2 is especially well suited for use within a low pressure/vacuum environment.

Also as shown in FIG. 2, ionization cell 15 may include an optional central ferrite core rod 20 disposed within electrode coil 18 and cylinder 16 to optimize power transmission between HVPS 13 and outer ion emitter 17. When this is the case, ionization cell 15 may be electrically considered as a LC resonant circuit with an impedance that preferably matches the frequency of signal provided by HVPS 13. In some alternative embodiments, the hollow space inside the dielectric channel may be filled by encapsulating material to avoid any possibility of electrical breakdown of the dielectric channel between electrodes 17 and 18.

Figure 5:
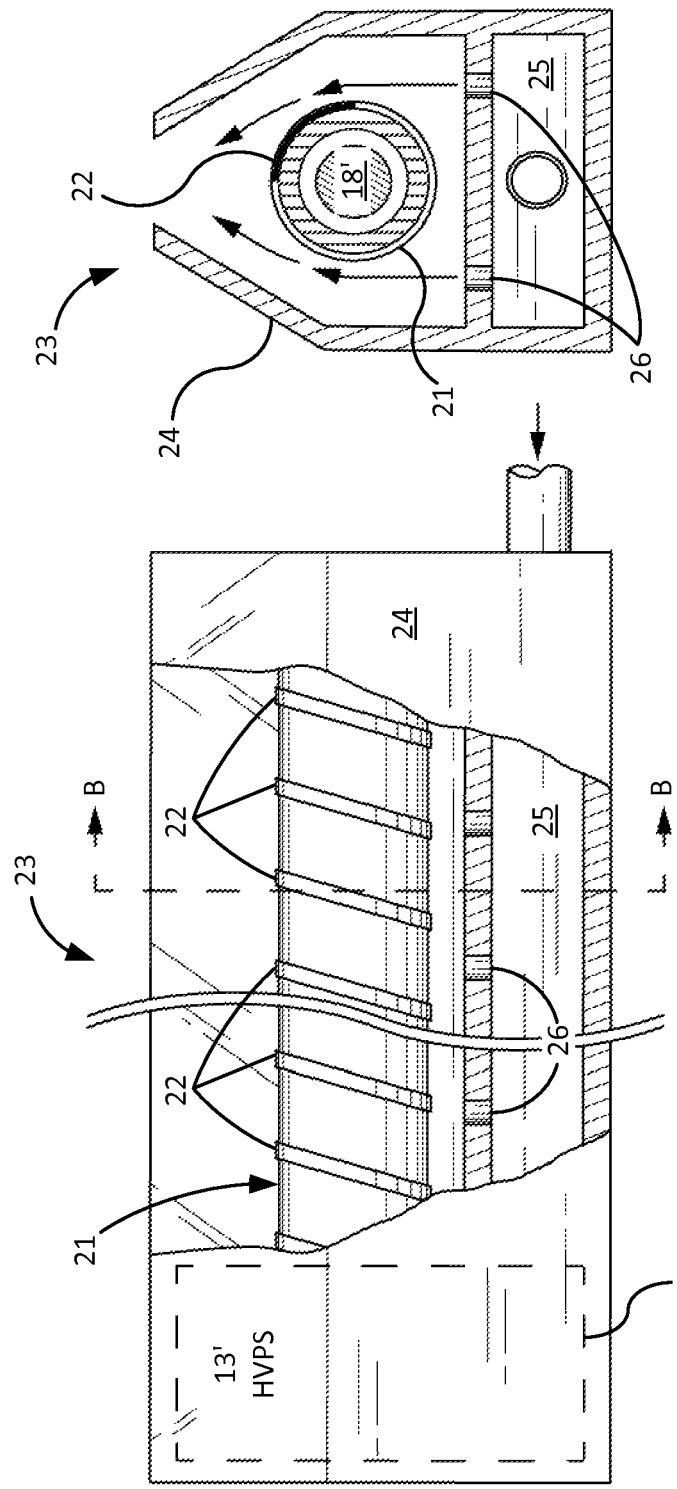
FIGS. 5A and 5B are, respectively, a partial side-elevation view and a side cross-sectional view an ionizing bar using the ionization cell of FIGS. 3A-3D.

In an alternative embodiment (not shown in FIG. 2 but shown in FIG. 5 and discussed with respect thereto) the high voltage section of power supply 13 (HV transformer—13') may be completely encapsulated, positioned inside of the vacuum/low pressure chamber, and directly connected to ionization cell 15. When this is the case the HV transformer 13' may be connected to a low voltage part of HVPS 13 (including an RF or micro pulse generator and driver) via a low voltage cable.

With joint reference now to FIGS. 3A-3D, various views of an ionization cell in accordance with a second preferred embodiment of the present invention are shown. In this preferred embodiment, an ionization cell 21 includes a printed/painted outer emitter electrode 22 configured as a flat conductive spiral band or ribbon. Cell 21 may have an inner high voltage electrode 18' that may be configured either as a conductive tube or as a spring 18 similar to the one shown in FIG. 2. In use reference emitter 22 is preferably electrically connected to a virtual ground and this ground may or may not be provided by the HVPS 13.

One advantage of this ionization cell design is that it provides a large and reliable contact area between the surface of dielectric cylinder 16 (in this example, preferably a ceramic with a 99% alumina substrate) and flat emitter/electrode 22. Most preferably, emitter 22 may be a flat titanium spiral/helical band with a pitch of about 4 mm, a width of about 1 mm, and a height of about 0.06 mm. Electrode/emitter 22 may be any one of a wide variety of conductive materials and electrode 22 may be screen printed (deposited) onto hollow ceramic tube 16 or applied in accordance with any other method known to ordinary artisans. When electrode 18' of ionization cell 15 is energized to a high voltage, a barrier discharge will be developed in the boundary area between edges of outer conductive electrode 22 and the adjacent outer surface of tube 16.

Figure 4:
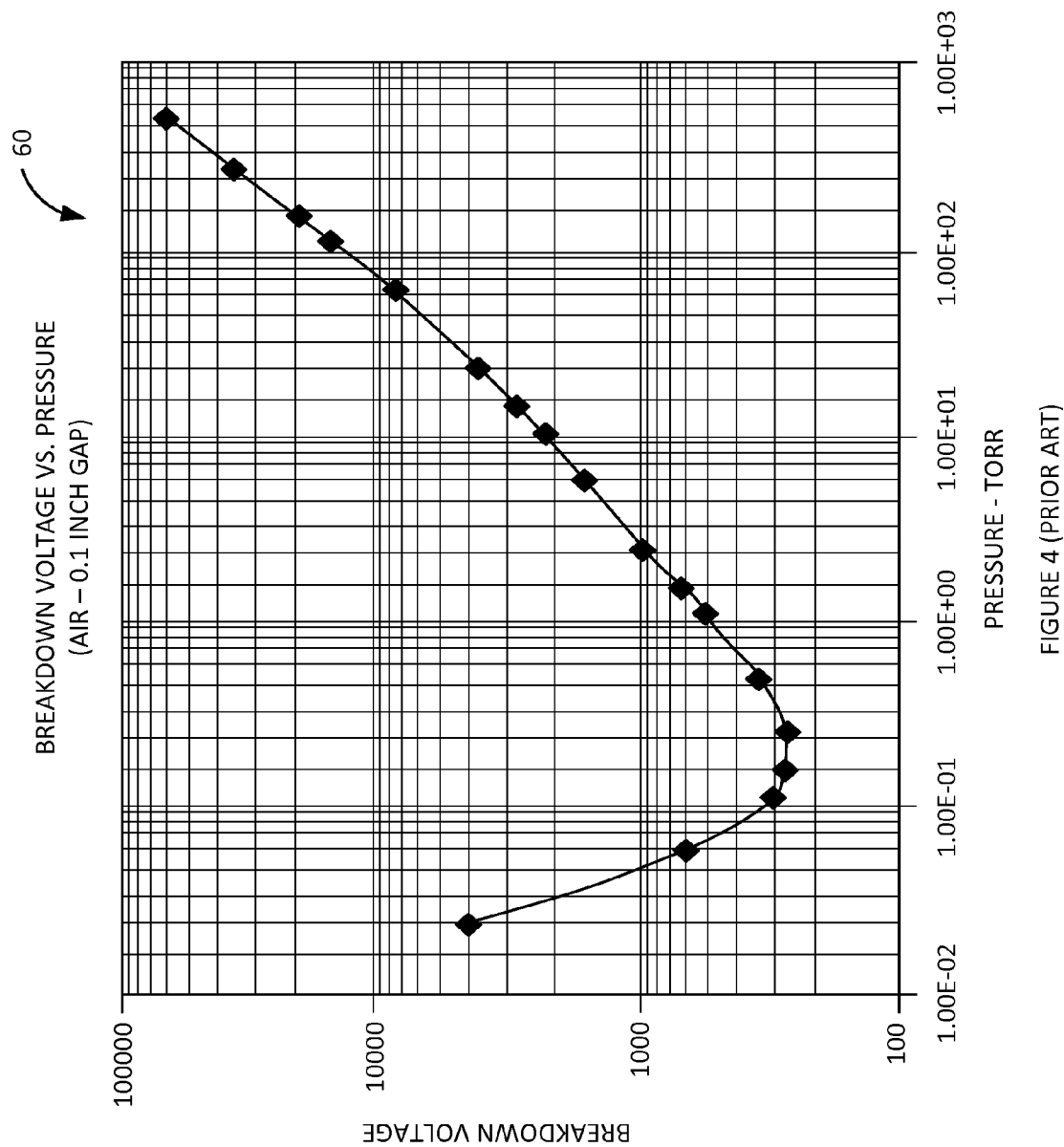
FIG. 4 is a prior art "Pashen Curve" plot showing the relationship between breakdown voltage and atmospheric pressure.

Variable and low pressure environments with which the invention is particularly advantageous present special challenges for high voltage devices. This is because uncontrolled electrical discharges/sparks are more likely to occur at middle and low pressures and because such discharges are likely to damage workpieces as well as the neutralizers/ionizers themselves. A prior art plot 60 of such breakdown voltage vs. atmospheric pressure (known as a "Pashen Curve") is shown in FIG. 4. The relationship of breakdown voltage vs. pressure (the precise Pashen Curve) for a given tool or a given chamber varies to some degree for different residual gases. Similarly, the precise Pashen Curve may vary based on different voltage waveforms. Thus, the precise Pashen Curve for any particular barrier discharge neutralizer in any particular application should be verified experimentally and design parameters chosen accordingly. For any given pressure, voltages above the level shown on the Pashen Curve will cause undesirable voltage breakdown/arcing. For this reason, it is preferable to have a minimum of high voltage sections/parts of a charge neutralizer exposed to the vacuum environment. In the example shown in FIG. 4, at pressures of about 1 Torr the breakdown voltage drops to a minimum level (named "Pashen Limit") of about 300 V and voltages lower than 300 volts must be maintained at such pressures.

FIGS. 5A and 5B are, respectively, a partial side-elevation view and a side cross-sectional view a barrier discharge ionizing bar 23 using the ionization cell 21 of FIGS. 3A-3D. This embodiment of a barrier discharge ionizing bar may correspond to the ionization cell 6" with gas assist of FIG. 1. This preferred embodiment of barrier discharge ionizing bar (BD bar) 23 may include a chassis 24 that supports ionization cell 21 and a small high voltage transformer 13' electrically connected with an inner high voltage electrode 18' similar to that shown in FIG. 3C (hidden from view in FIG. 5A). Bar chassis 24 also may accommodate a gas flow manifold 25 with number orifices 26. The manifold 25 may be connected to an inlet port 12 (See for example FIG. 1) for a low-flow "bleeding" gas supply that may enhance charge neutralization by locally increasing the concentration of ionizing gas and moving ions to a charged workpiece/web 3. Various bleeding gases may be selected by those of ordinary skill and examples include clean dry air (CDA), Nitrogen, and Argon. Barrier discharge ionizing bar 23 may also have applications where ozone emission should be minimized; in which case manifold 25 can be connected to vacuum pump port 11 of the type shown in FIG. 1 to evacuate possible ozone excess.

Figure 6:
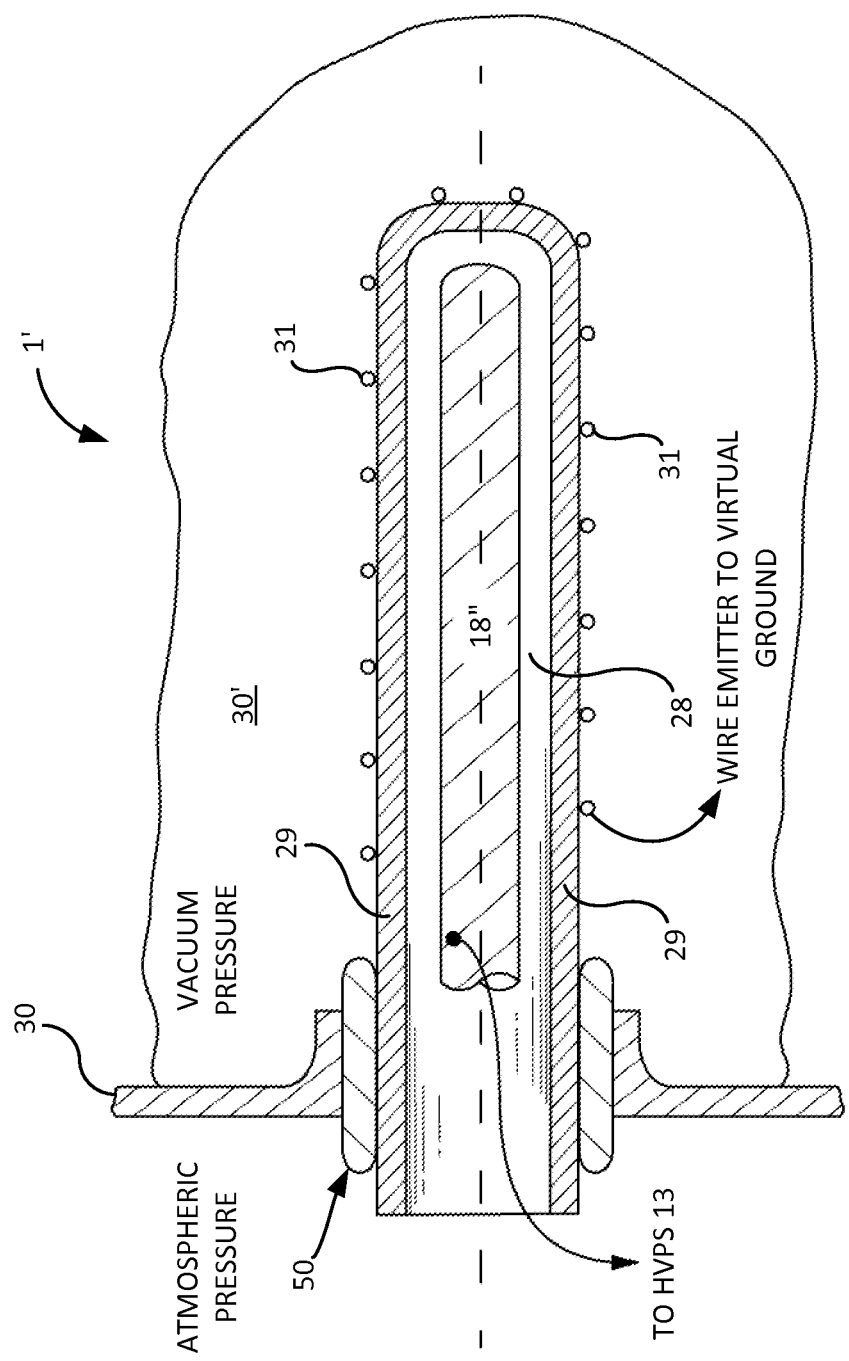
FIG. 6 is a cross-sectional view of a one-side-closed ionization cell in accordance with a third preferred embodiment of the present invention.

FIG. 6 is a cross-sectional view of a one-side-closed ionization cell 27 in accordance with a third preferred embodiment of the present invention. In this embodiment inner high voltage electrode 18" is disposed in spaced relation within a hollow dielectric tube 29 that is closed off on the end extending into a vacuum chamber 1. Dielectric tube 29 may be positioned in special extension port of the vacuum chamber 1 (as shown) or it may be hermetically sealed in the wall of a tool. Cell 27 may also include an outer electrode 31 that may be configured as a wire mesh such as a stocking that surrounds the outer surface of closed tube 29. One advantage of this embodiment is that, in middle to low pressure applications, only outer electrode 31 is exposed to the low pressure space/vacuum and emitter 31 is electrically connected to a low voltage power supply (or to a low voltage terminal/port of HVPS 13). Since inner high voltage electrode 18" and the associated cable connections to the HVPS 13 are all positioned outside of the vacuum tool/chamber in a space having normal atmospheric pressure, voltage breakdown (as predicted by the applicable Pashen curve) within the vacuum chamber 1 may be easily avoided with appropriate design. As with reference emitter 17, reference emitter 31 is preferably electrically connected to a virtual ground and this ground may or may not be provided by the HVPS 13.

Figure 7:
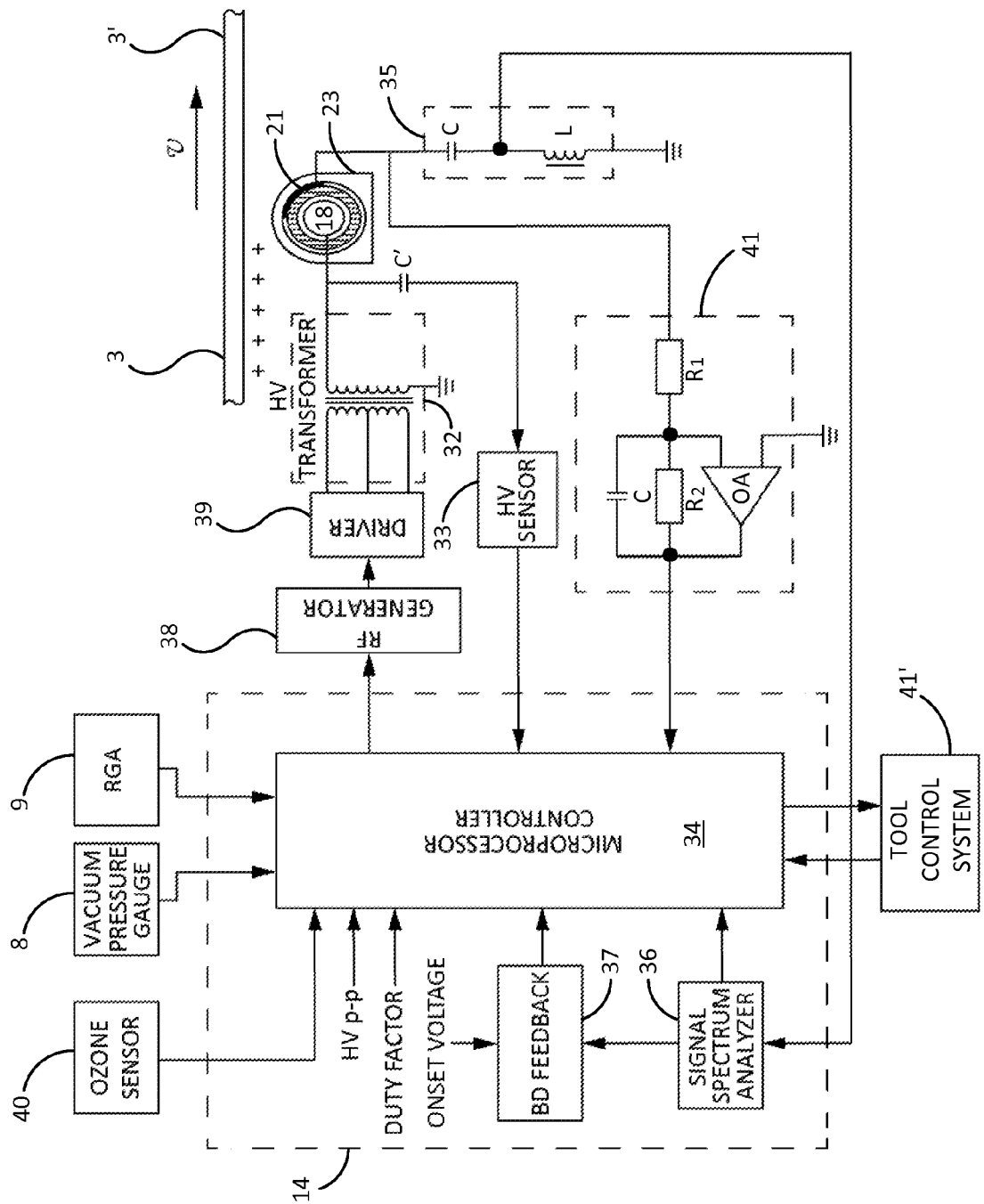
FIG. 7 is a simplified representation of a barrier discharge neutralizer with ionizing bar in accordance with a preferred form of the invention.

FIG. 7 is a simplified representation of a barrier discharge neutralizer with ionizing bar 23 and a HVPS (radio frequency or micro pulse) in accordance with a preferred form of the invention. More particularly, the neutralizer embodiment of FIG. 7 includes two alternative microprocessor based control systems. Each will be discussed below. As shown in FIG. 7, ionization bar 23 (which may be at least substantially similar to bar 23 discussed in FIG. 5) is positioned in close proximity to a charged workpiece such as a wafer or a moving film or web 3. Inner high voltage electrode 18 of bar 23 may be electrically connected to a secondary coil of high voltage transformer 32 and a contactless (capacitive) voltage sensor 33 (for example, a peak detector) may be connected to an input of a microcontroller 34. This makes it possible to monitor the voltage applied to the barrier discharge ionizing bar 23 in real time, which is desirable in vacuum/low-pressure environments of the type discussed herein.

As shown in FIG. 7, emitter electrode 21 of bar 23 is electrically connected to a high pass LC filter 35 (which may be either an active or passive LC filter) and to a barrier discharge signal spectrum analyzer 36. Analyzer 36 is connected to microcontroller 34 and it may serve to decrease/cut-off low frequency noise signals and subtract discharge related informative signals from filter circuit 35. Higher frequency signals (typically in the megahertz range) are associated with different modes (for example, glow, filamentary, diffused, etc.) of the barrier discharge ionization. The resulting signal from analyzer 36 and an onset voltage can be converted into a control system feedback signal to controller 34 by comparator 37. Thus, the aforementioned circuitry may comprise a status monitor circuit, the circuit cooperating with the reference emitter to produce a barrier discharge detection signal in response to barrier discharge occurring at the interface of the reference emitter and the outer surface of the dielectric channel. In alternative embodiments, the same comparator 37 may also permit manual setup of BD onset voltage for the ionizing bar 23.

In accordance with the invention, the control system 14 (also shown in FIG. 1) comprising blocks 33, 35, 36, and 37 and may be integrated with or separated from high voltage power supply 13. The primary coil of the transformer 32 may be connected to an RF generator 38 (frequency range 20-100 kHz) and a driver 39. Microcontroller 34 adjusts and monitors the output of HV transformer 32 using signals to and from blocks 33, 35, 36 and 37. Barrier discharge onset/threshold voltages can be automatically extracted from the noise because of the large difference (more than two orders of magnitude) between discharge generated signals and RF generator 38 frequencies.

Also as shown in FIG. 7, microcontroller 34 may also be connected to a vacuum pressure gauge 8 and/or to a RGA (Residual Gas Analyzer) 9 (see also FIG. 1). In some applications ozone concentration during BD discharge should be monitored. In such cases, an optional ozone sensor 40 can also be connected to controller 34 and the maximum HV output will be preferably limited by acceptable ozone concentration levels. Control system 14 of the FIG. 7 charge neutralizer may also be in electrical communication with a tool control system 41'.

The second FIG. 7 control system (for both RF and micropulse HVPS) will be discussed immediately below. According to this embodiment, ionization cell 23 can work as an ionizer and as an electrostatic charge/electrical field monitoring device at the same time. Preferably, active low pass filter 41 (comprising resistors R1, R2, C, and op amp OA) is connected to the ion emitter of cell 23, to microcontroller 34, and to ground. The ion emitter of cell 23 creates a bipolar ionized/conductive cloud distributed around its perimeter. In this case emitter 18 and the ion cloud will have virtually zero potential relative to the ground. This cloud reacts to any electrical field from a charged object (such as a web 3 or a semiconductive wafer) positioned near emitter 18. If a charged object is within proximity of emitter 18, oppositely charged ions from the cloud will move to the charged object. In response, positive current goes from the ground to emitter 18 to restore the charge balance of the ion cloud according the law of charge conservation. When web 3, film or other potentially charged object is not moving (for example, when the tool is in standby/sleep mode) ionization cell 23 is in a balanced condition and can be powered with high voltage only slightly above barrier discharge onset voltage level (in "sleep mode"). Under this condition the AC emitter signal is monitored by high pass filter 35 to confirm barrier discharge status/activity and ionization.

The low pass filter 41 preferably only monitors the DC component of current $I_{em}$ flowing from emitter 18 to ground. If the web 3 does not carry any charge and/or is not moving, the ions in the cloud that emanates from emitter 18 are not electrically induced to flow elsewhere and, thus, current $I_{em}$ will be close to zero or equal to zero. In this way, low pass filter 41 may act as a charge carrier balance detection sensor/circuit. If web 3 starts moving, it may carry electrical charges with linear density Q [C/m] that moves with web 3 at velocity υ [m/s]. This creates a Transfer Current $I_{TC}$ where:

$$I_{TC} = Q\upsilon [\text{Amperes}]$$

The charged web, thus, simultaneously creates a Transfer current and an electrical field which interacts with the ion cloud of the emitter 18. The result is that web 3 attracts ions of an opposite polarity and charge neutralization occurs. If ionization cell 23 neutralizes all web 3 charges, the neutralization current through filter 42 will be:

$$I_{cm} = I_{TC}.$$

In general, the neutralization current from an ionization cell is less than the Transfer current:

$$I_{cm} = k\, I_{TC} = k\, Q\upsilon [\text{Amperes}]$$

where: Q is the charge density of the web 3; where k is the coefficient efficiency of charge neutralization (usually in the range of about 0.80 to about 0.95); and where υ is the web velocity.). Usually, the web velocity signal can be received from the tool control system 41'. Tool control system 41 and controller 34 preferably continually monitor the magnitude and polarity of the neutralization current so the linear charge density of web 3 can be calculated.

If neutralization current $I_{cm}$ or charge density Q of the web 3 is higher than some preset level selected to be technologically-acceptable, low pass filter 41 switches HVPS 13 from a sleeping mode to a normal neutralization operational mode.

Figure 8:
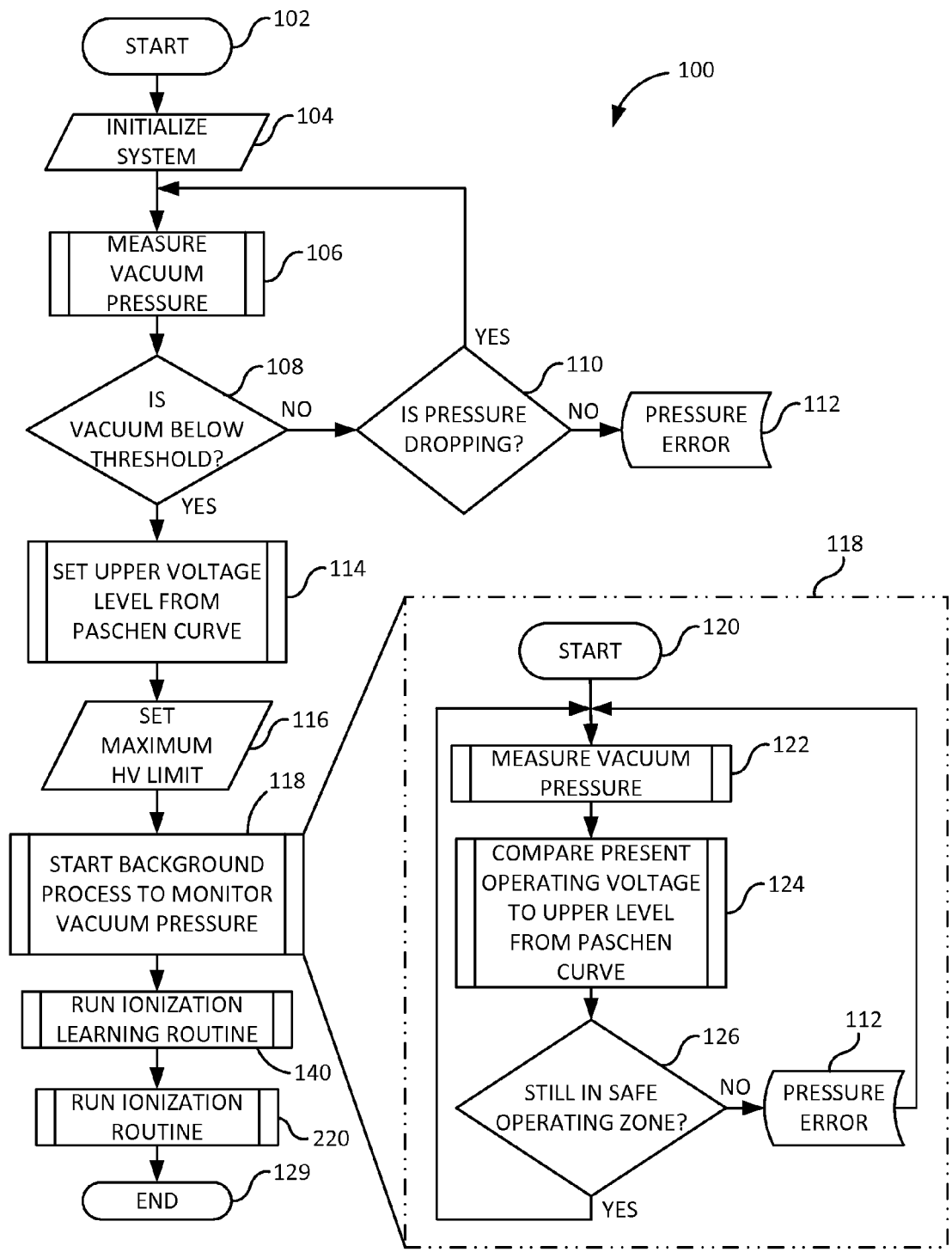
FIGS. 8 and 8A show flow charts illustrating the preferred functionality of the main neutralizer loop for use with the barrier discharge neutralizer in accordance with FIG. 7.
Figure 8A:
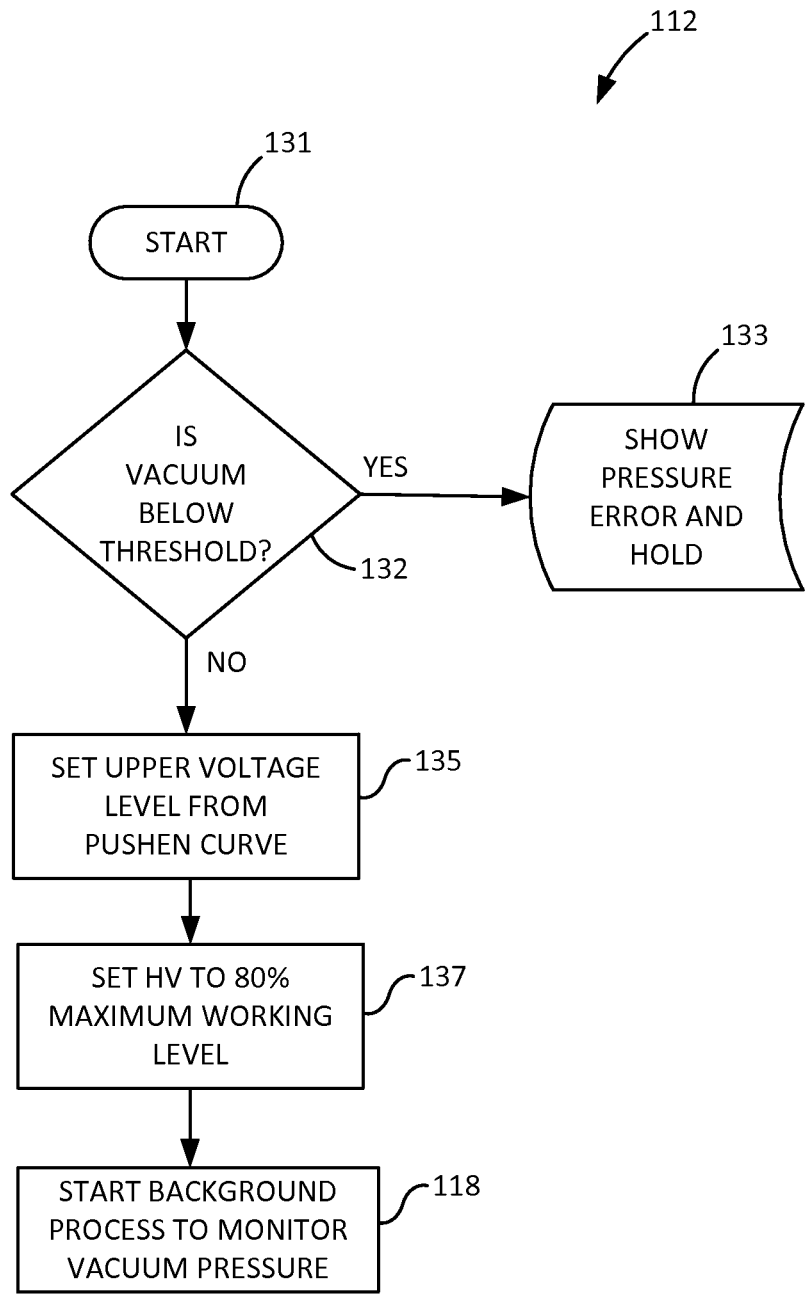

A preferred method 100 of operating the barrier discharge neutralizer of FIG. 7 is shown in FIGS. 8 and 8A. As shown therein, when the neutralization system starts 102, the system initializes and configures the hardware, and input and output ports (I/O) 104. The vacuum pressure of the sealed middle to low pressure chamber is then measured 106 and compared to maximum operating pressure value 108 as derived from the Paschen Curve 60. If the pressure in the chamber is not low enough, the measured pressure is then compared to previous pressure readings to determine whether the pressure is dropping 110. If so, steps 106 and 108 are repeated until the measured pressure is below a predetermined threshold value. Otherwise, an error is issued 112. When a pressure error occurs control is transferred to a pressure error handling subroutine 130. If the measured pressure is above operating threshold 132 the error is indicated and the system holds 133 until corrective action is taken. Conversely if the pressure is below threshold the error is handled 135 137 138 during the other operating routines, discuss later in this document.

When the pressure threshold value is reached, the upper high voltage (HV) level to be applied to the barrier discharge ionization cell is set 114 based on the applicable Paschen Curve and the presently measured vacuum pressure. An absolute maximum HV value is the calculated and set 116 to be slightly higher than the upper high voltage level. A background process 118 is then started 120 to continuously monitor the vacuum pressure in the sealed chamber. In this process, the measured 122 vacuum pressure is compared to the current operating HV level 124 as calculated from the applicable Paschen Curve. If the pressure and/or the high voltage is outside a predetermined safe operating zone 126 an error is issued 128 and control is passed to the pressure error handling subroutine 130. If the measured pressure is above operating threshold 132 the error is indicated and the system holds 133 until corrective action is taken. Conversely if the pressure is below threshold the a new upper voltage level is set as determined from the Paschen Curve and a the Maximum working 137 is reset to 80% of the new upper voltage level. And the pressure monition background process continues 138 at 122.

After the pressure monitor process 118 is started, the operating ionization conditions are learned 140 (details below), and the ionization operating routine is run 220 (details below) based on the learned conditions until terminated 134 due to removing power and/or issuance of an error condition.

Figure 9:
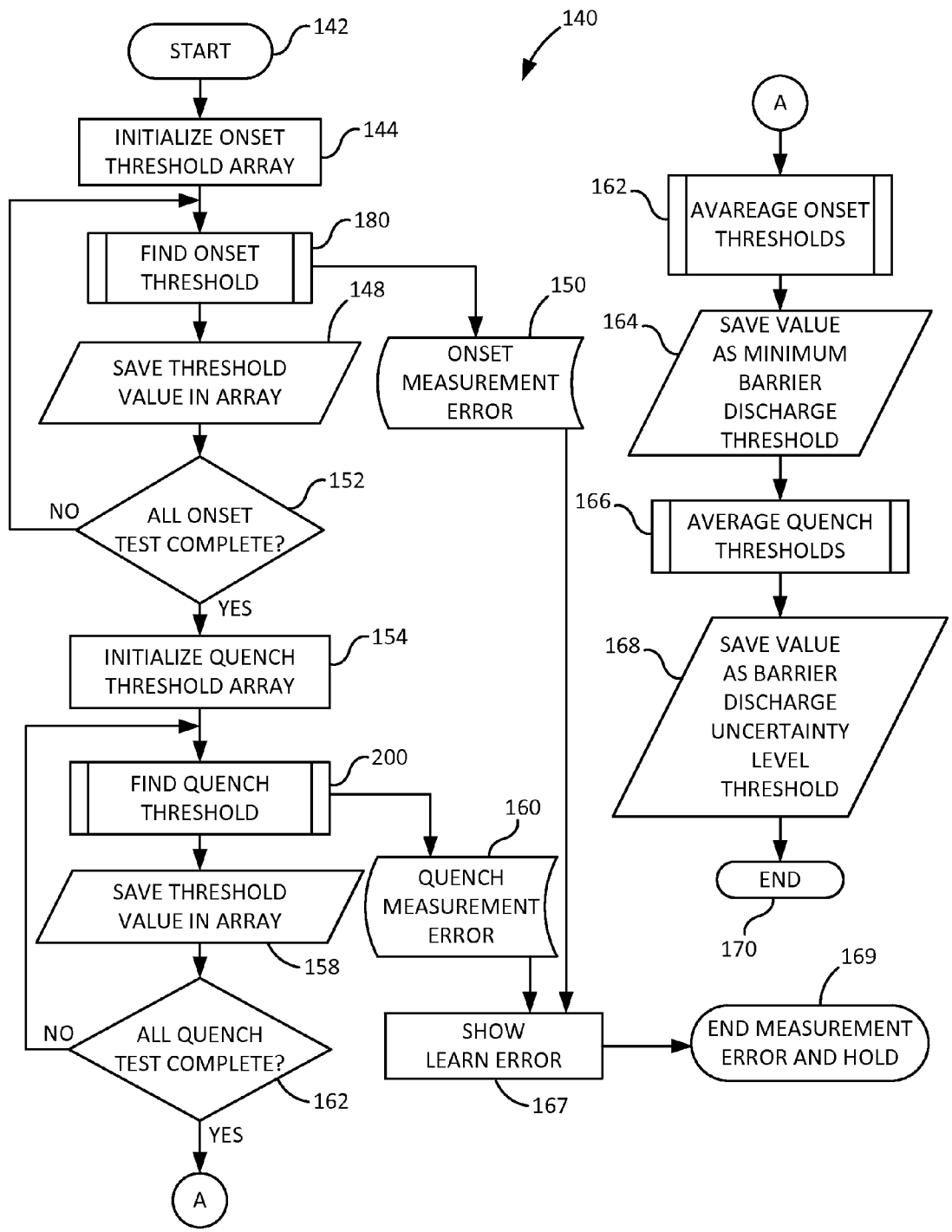
FIG. 9 shows a flow chart illustrating the preferred functionality of the ionization learning routine for use with the barrier discharge neutralizer in accordance with FIG. 7.

The ionization learning routine 140 of FIG. 9 includes two called routines 180 and 200 (shown in FIGS. 10A and 10B, respectively, and described in detail below) for finding the point at which the barrier discharge begins (Onset), and the point at which the barrier discharge stops (Quench). Routine 140 starts 142 by initializing 144 the threshold array to hold several Onset measured values and that will analyzed in a later process. Routine 180 is then called to find 180 the onset voltage threshold and the threshold value is saved 148 in the threshold array. If an Onset threshold cannot be found, an onset measurement error is issued 150. Control is then passed to the onset error handling subroutine 163 where the Learn error is indicated and 167 and the system resides in a hold state 169 until corrective action is taken. A determination 152 is then made as to whether all onset tests are complete. If not, the process passes to step 180 and proceeds accordingly. Otherwise, the quench threshold array is initialized 154 and routine 200 is then called to find 200 the quench voltage threshold. The resulting threshold value is then saved 158 in the threshold array. If a quench threshold cannot be found, a quench measurement error is issued 160. Control is then passed to the quench error handling subroutine 165 where the Learn error is indicated and 167 and the system reside in a hold state 169 until corrective action is taken. A determination 162 is then made as to whether all quench tests are complete. If not, the process passes to step 200 and proceeds accordingly. Otherwise the process passes to step 162 where the saved onset threshold values, saved in the onset array, are averaged 162 and the result saved 164 as a minimum barrier discharge threshold. This will be used later as an operating condition for the ionization run routine 220. The process then passes to step 166 where the saved quench threshold values, saved in the quench array, are averaged 166 and the result saved 168 as a barrier discharge uncertainty level threshold. This will be used later as an operating condition for the ionization run routine 220. Process 140 then terminates 170.

Figure 10A:
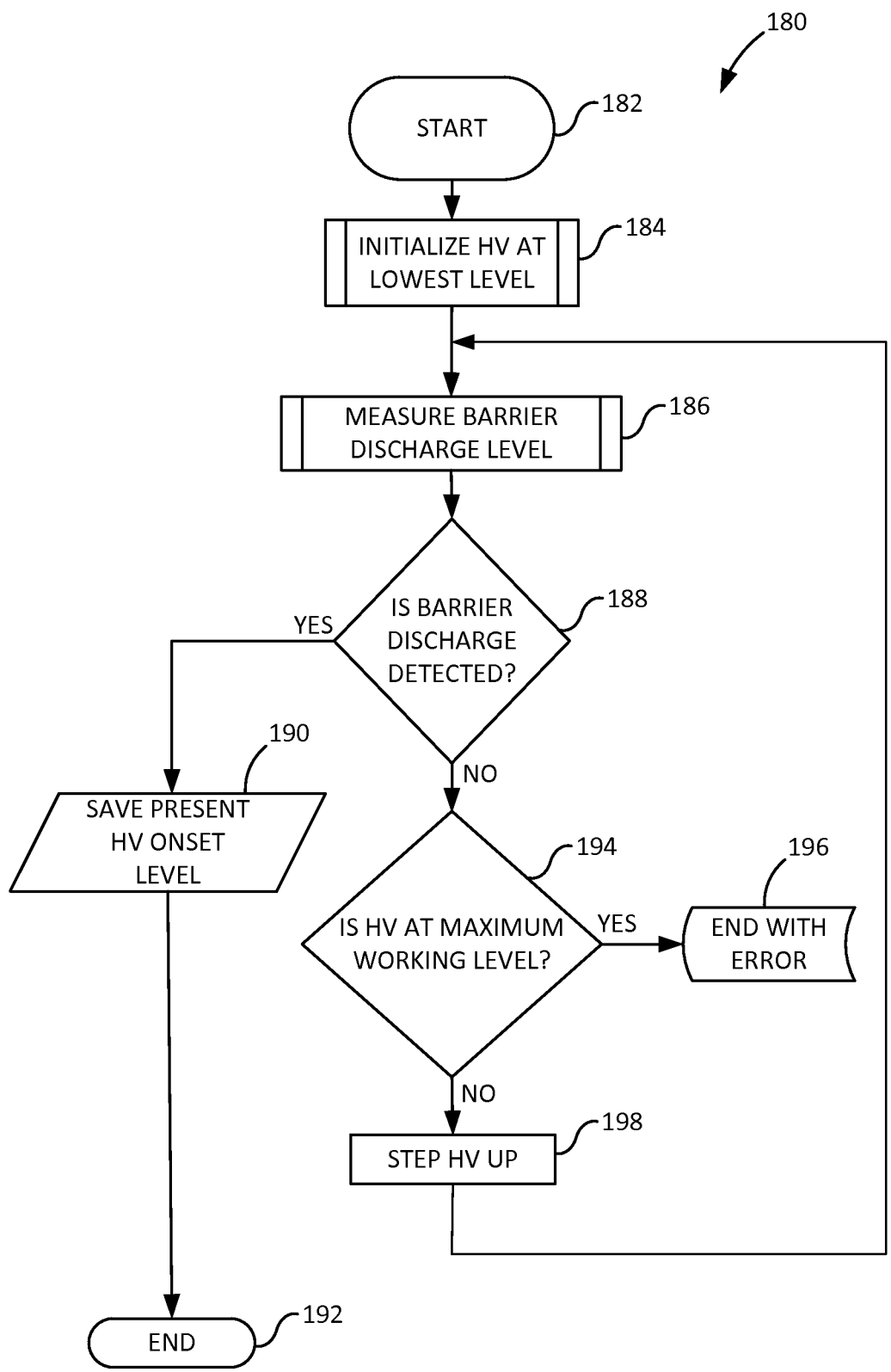
FIG. 10A shows a flow chart illustrating the preferred functionality of the set threshold routine for use with the barrier discharge neutralizer in accordance with FIG. 7.

The onset barrier discharge level process 180 of FIG. 10A, searches for the high voltage level where barrier discharge starts as the high voltage is increased. The process starts 182 with initializing 184 the voltage level from a level known to be below the onset level. The barrier discharge level is measured 186 and it is determined 188 whether barrier discharge is detected. If so, the measured high voltage onset level is saved 190 in the onset threshold array 148 and the process terminates 192. Otherwise, the high voltage level is compared 194 with the previously determined maximum high voltage level. If so, the process ends 196 with an error message 150. Control is then passed to the onset error handling subroutine 163 where the Learn error is indicated and 167 and the system reside in a hold state 169 until corrective action is taken. Otherwise, the high voltage level is incremented 198 and the process returns to step 186 and proceeds accordingly.

Figure 10B:
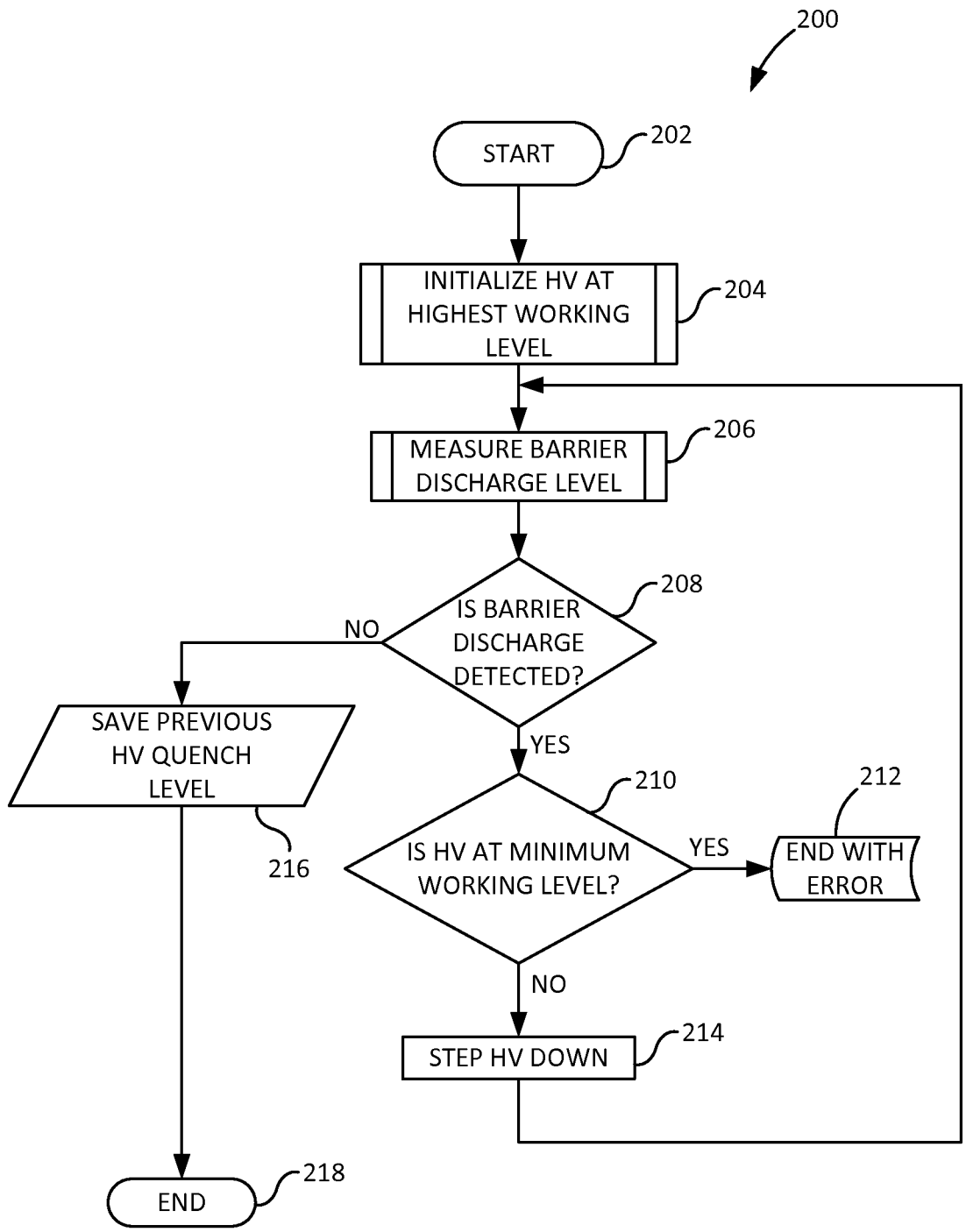
FIG. 10B shows a flow chart illustrating the preferred functionality of the quench threshold routine for use with the barrier discharge neutralizer in accordance with FIG. 7.

The quench threshold level process 200 of FIG. 10B, searches for the high voltage level where barrier discharge stops as the high voltage level is deceased. The process starts 202 with initializing 204 the voltage level to be the previously determined highest working voltage level. The barrier discharge level is measured 206 and it is determined 208 whether barrier discharge is detected. If detected, the present high voltage level is saved as the "previous high voltage level". The high voltage level is compared 210 with the previously determined minimum high voltage working level. If the high voltage level is less than or equal to the minimum high voltage working level, the process ends 212 with an error message 160 and corrective action must be taken. Otherwise, the high voltage level is decremented 214 and the process returns to step 206 and proceeds accordingly. If the barrier discharge is not detected, The present high voltage level is discarded, and the saved "previous high voltage level" is save as the quench level 216 in the quench threshold array 158, and the process terminates 218.

Figure 11:
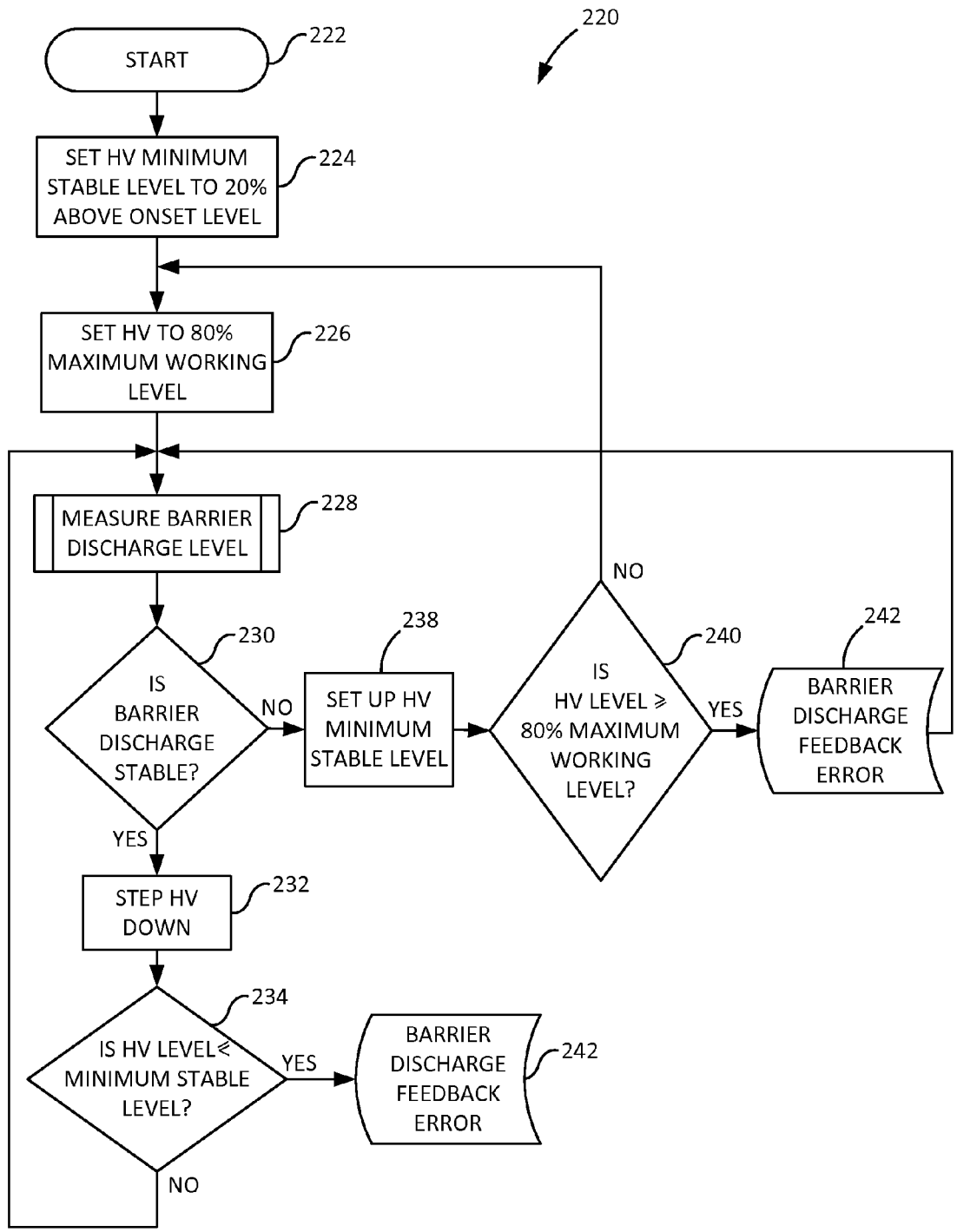
FIGS. 11 and 11A show flow charts illustrating the preferred functionality of the ionization routine for use with the barrier discharge neutralizer in accordance with FIG. 7.
Figure 11A:
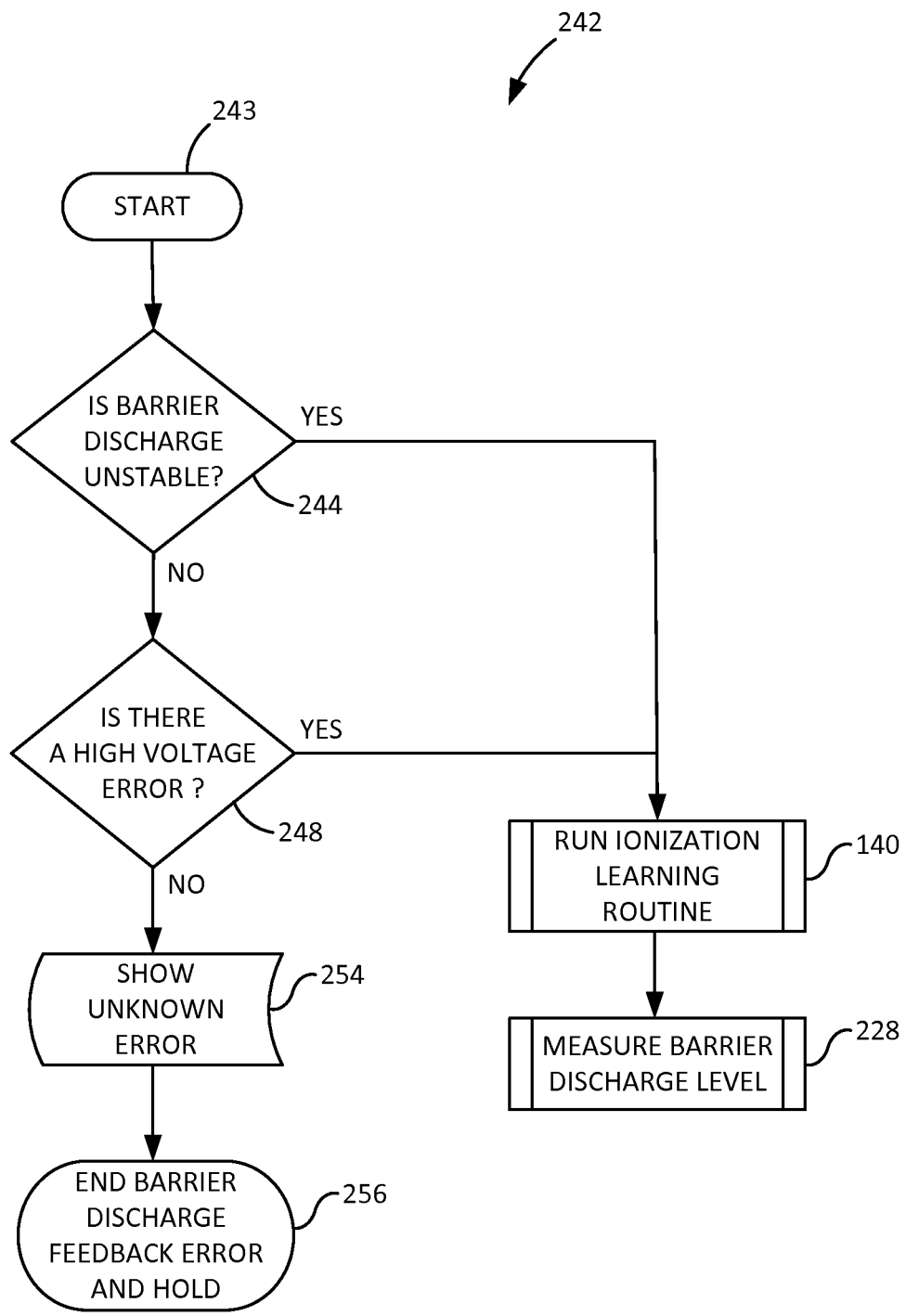

Once the learn routine has competed successfully, the system enters the ionization run routine 220 of FIGS. 11 and 11A where it remains until power is removed or an error condition(s) is issued. This process maintains the barrier discharge at an operating point between Onset and 80% of maximum working high voltage level. The ionization run routine 220 begins 222 by setting 224 a minimum stable high voltage that is about 20% above the onset barrier discharge level (as determined in process 180), and then setting the high voltage level 226 to 80% of the maximum working level. The barrier discharge level is measured 228 and a determination 230 is made whether the barrier discharge is stable. If so, the high voltage is decremented 232 and a determination 234 is made whether the high voltage level is less than or equal to a minimum stable level. If so, a barrier discharge feedback error is issued 236 and corrective action must be taken. Otherwise, the process returns to step 228 and proceeds accordingly.

If at step 230 it is determined that the barrier discharge is unstable, a minimally stable high voltage level is set 238 and a determination 240 is made whether the high voltage level is greater than or equal to 80% of the maximum working level. If so, a barrier discharge feedback error is issued 242 and control is passed to the Barrier Discharge Feedback error sub routine 240. Here the Barrier Discharge level is evaluated 244 and if found to be unstable a relearn is initiate 246 and upon successful completion resumes the ionization routine 250, resume operation at 130. Similarly if the Barrier Discharge level is stable but the High voltage is cause of the error, a relearn is initiate 246 and upon successful completion resumes the ionization routine 250. Lastly, it the error is neither, the error is indicated and 254 and the system reside in a hold state 256 until corrective action is taken.

Figure 12:
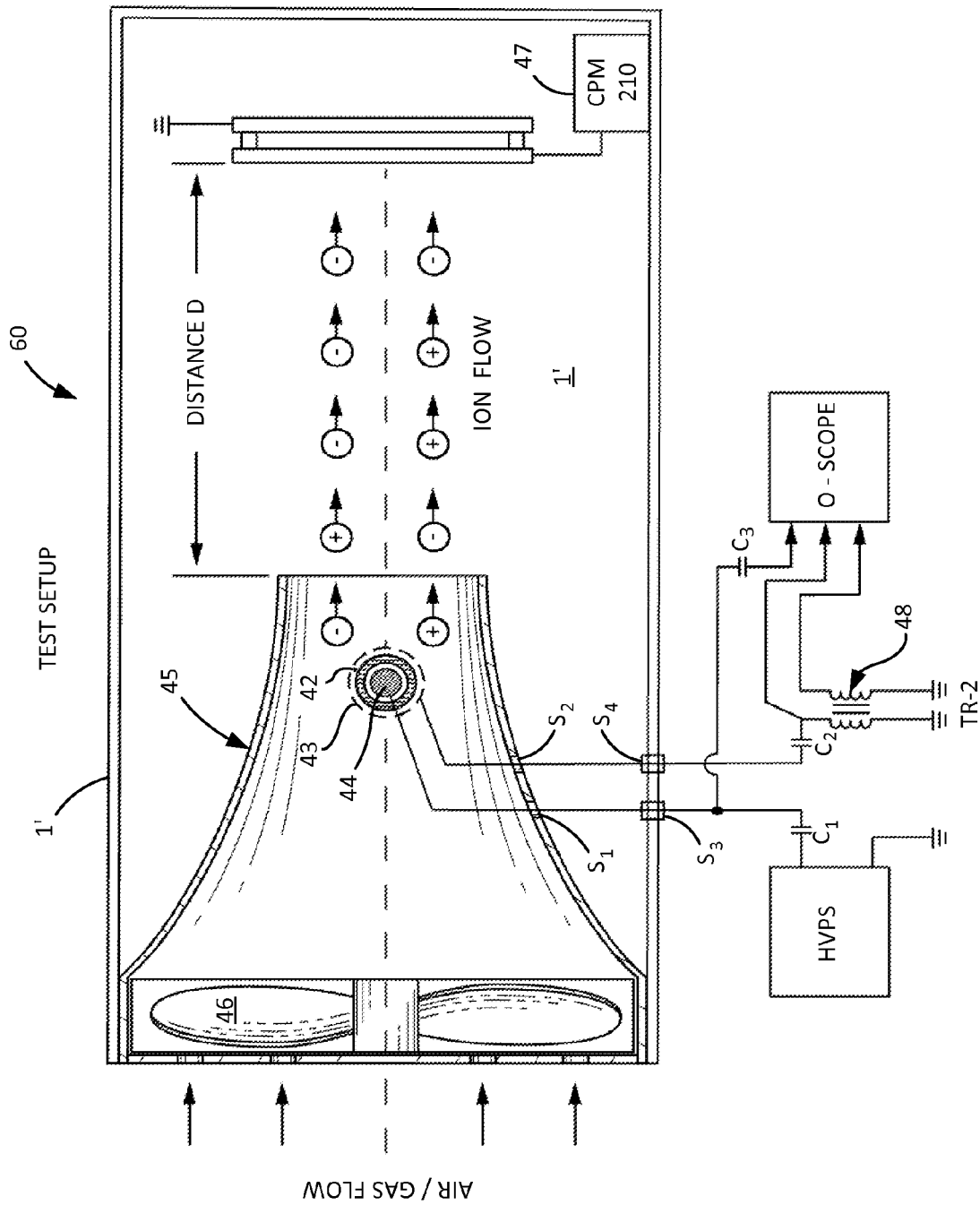
FIG. 12 is a simplified representation of a test apparatus for one possible prototype implementation of the invention to generate various empirical data as further illustrated in FIGS. 13-16.

Turning now to the TEST SETUP 60 of FIG. 12, there is shown therein a simplified representation of a test apparatus used with a prototype implementation of the invention to generate various empirical data as further illustrated in FIGS. 13-16. Feasibility tests for barrier discharge ionization cells were run on setup 60 in lab experiments at normal atmospheric pressure. One goal of these experiments was to verify the feasibility of ion generation using relatively simple and scalable BD ionization cells. Another goal was to identify performance characteristics of scalable BD ionization cells such as (1) ion balance, and (2) range of positive and negative discharge times at different voltage amplitudes. The BD ionization cells tested were powered by conventional RF and micro-pulse high voltage power supplies at different times to yield comparative results. Overall, the feasibility tests described herein show that BD ionization cells of the type discussed throughout have applications at normal atmospheric pressure, particularly when configured as an ionizing blower.

The test apparatus depicted in FIG. 12 comprises a housing 1' to support various components described below. The apparatus includes an ionization cell 43 with a ceramic tube 42 having a length of about 50 mm, an outer diameter of about 6 mm and a wall thickness about 1 mm. A tungsten wire outer electrode with a diameter of about 60 microns is disposed on the outer surface of tube 42 in a spiral/helical pattern. The spiraled tungsten wire has a winding pitch of about 3-4 mm and an active length of about 100 mm. An inner high voltage electrode 44 comprises a thin bronze tube positioned inside ceramic tube 42 that is capacitively coupled to a conventional a HVPS (both RF and micro-pulse ionizing signals were tested) by capacitor $C_1$. The outer electrode is capacitively coupled via capacitor C2 to ion current/voltage monitoring circuit 48 and ground. The circuit 48 is a high pass filter which includes a small auxiliary transformer TR 2 (JC-90086C) or inductor and scope. Further, ionization cell 43 is installed inside plastic duct 45 to direct airflow to cell 43. Air flow was provided by a standard 24 VDC fan 46 similar to those used in Simco-Ion XC-2 ionizing blowers. Ion balance and discharge times were measured by "CPM (Charge Plate Monitor) model 210" 47 at a distance "D" of about 15 inches. A discharge monitoring circuit 48 includes an LC high pass filter (C2 and the primary of TR-2) and the output of the circuit is fed into a conventional oscilloscope. In separate tests, the high voltage power supply operated in either RF or in micro-pulse mode to thereby power the tested ionization cell 43 with an adjustable output voltage in the range of about 2 kV to about 7 kV.

Figure 13:
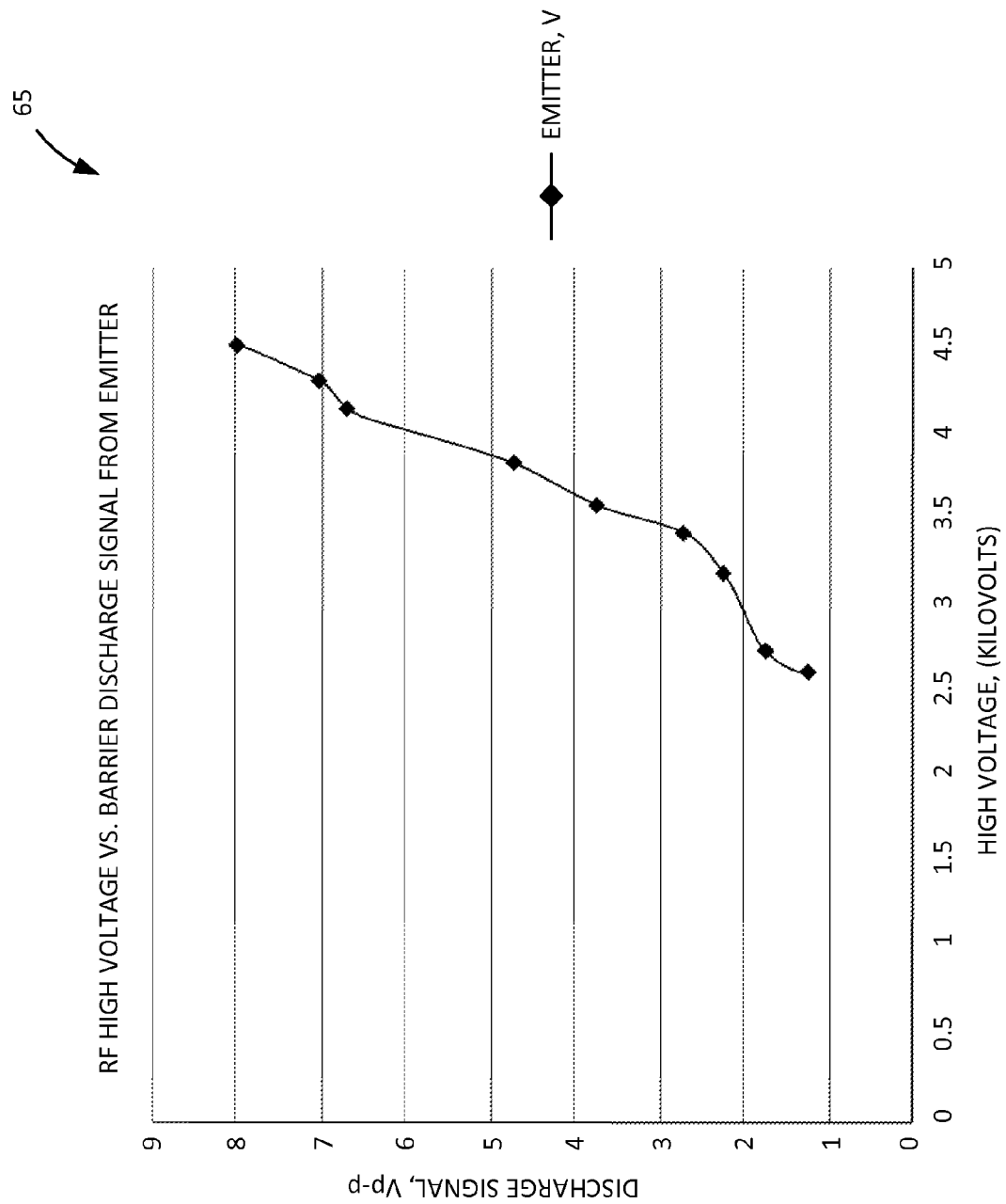
FIGS. 13-16 illustrate various empirical data generated using the test apparatus of FIG. 12.

The chart 65 of FIG. 13 shows test results of a BD ionization cell 43 powered by a high voltage sine wave with frequency of 8.7 kHz (in the radio frequency range). Since capacitively coupled ionization cell 43 operates in "self balanced" mode, ion balance was measured to be in the range of about 0+/−5 V and practically independent of the amplitude of the applied high voltage. The BD ionization cell 43 was measured to have an onset voltage in the range of about 2.6-2.8 kV (see high voltage presented along the x axis in kilovolts). The BD discharge generates signals of a relatively large amplitude (in the range of about 1.5-8 V depending on the ionizing voltage applied) and of a frequency close to about 10-15 MHz. Therefore, the onset voltage and discharge intensity could be monitored with the simple the high pass filter 48.

Figure 14:
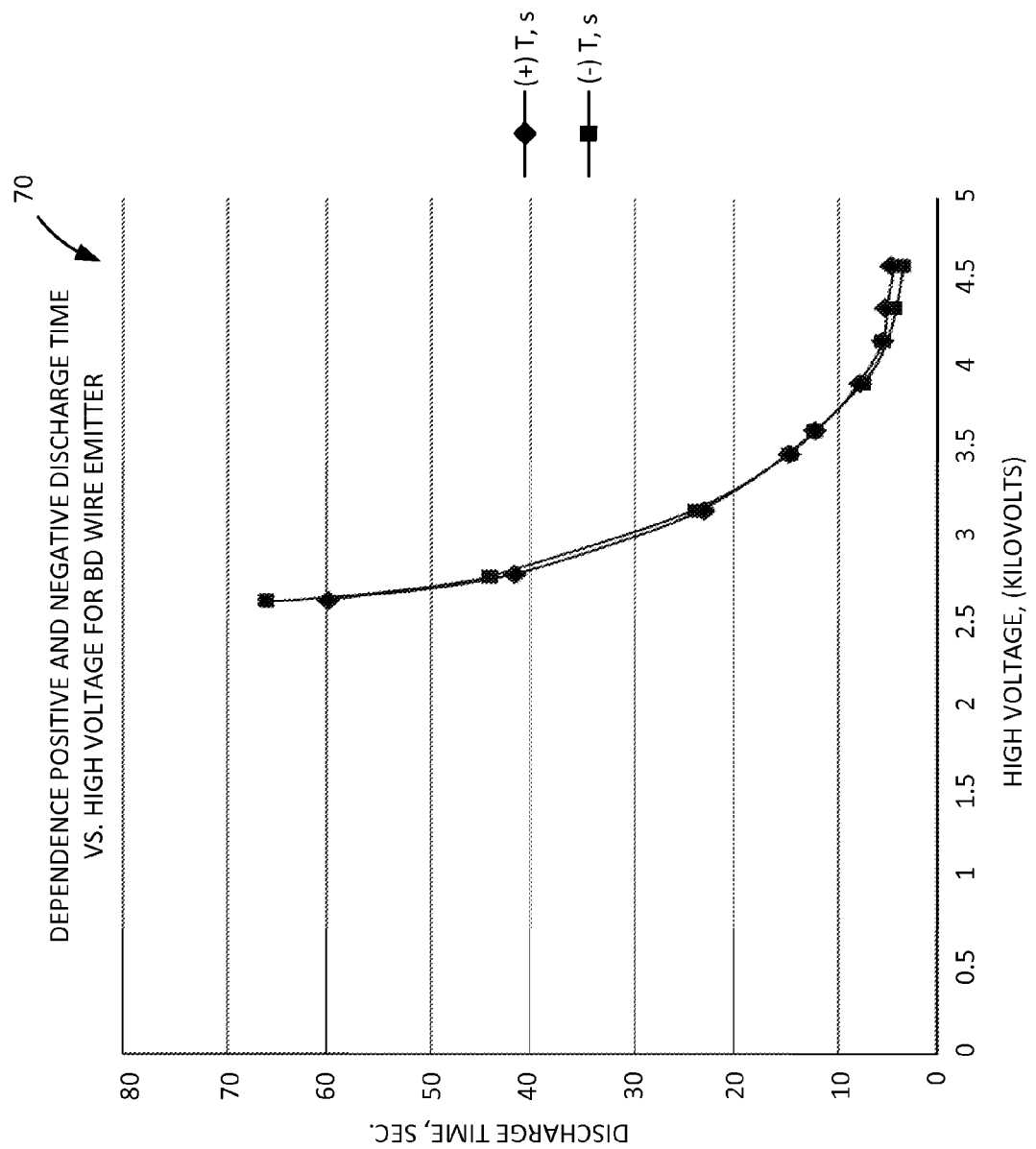

The chart 70 of FIG. 14 shows the relationship between measured discharge times and the absolute value of the amplitude of the high voltage RF signal applied to inner emitter 44 during testing. The plotted curves shown indicate that significant increases in the absolute value of the RF high voltage signal applied to inner high voltage emitter 44 were necessary to significantly decrease discharge times.

Figure 15:
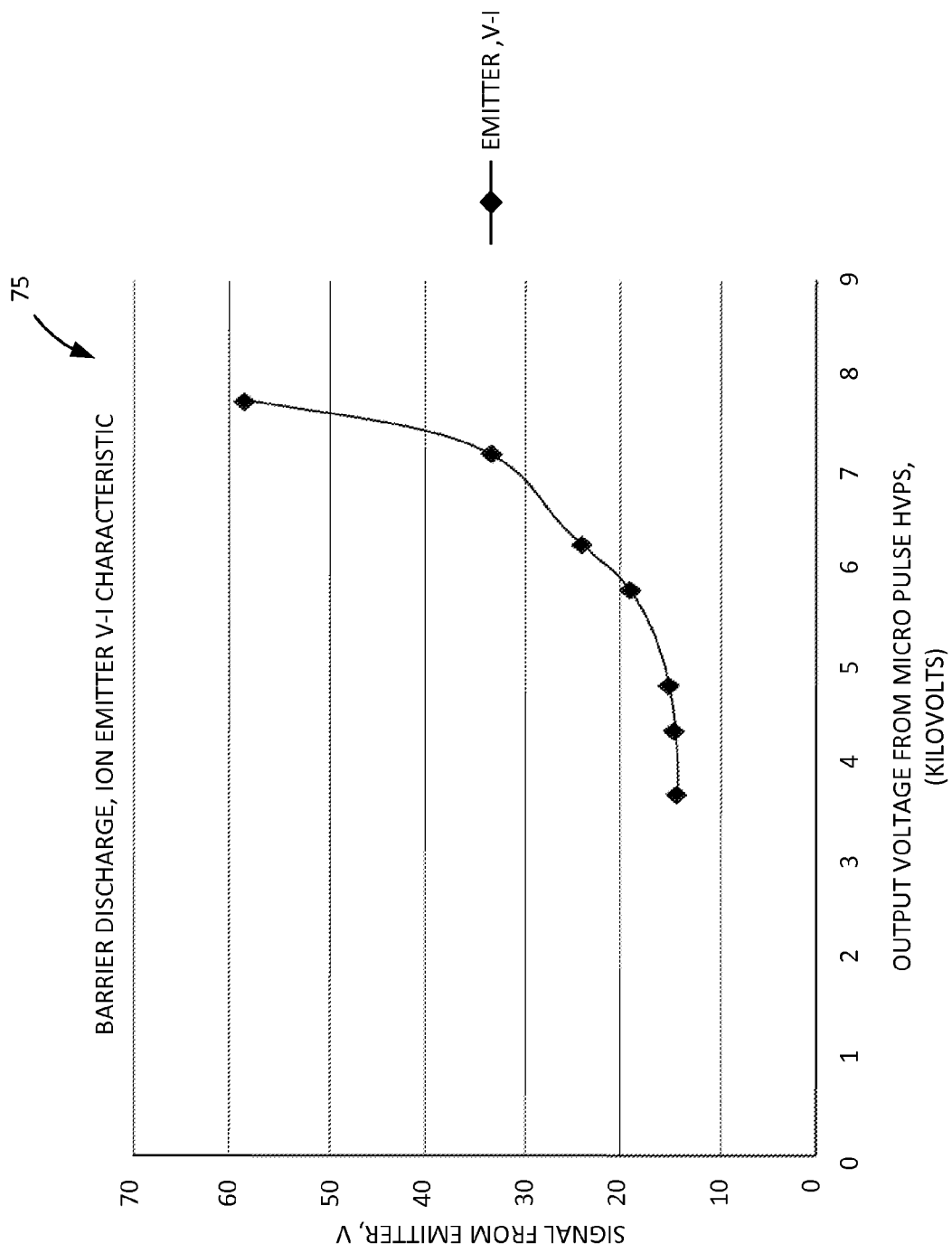

The chart 75 of FIG. 15 shows test results of BD ionization cell 43 powered by a micro-pulse HVPS. In this case, the emitter signal was amplified by the auxiliary transformer 48 (as depicted in FIG. 12). As measured and shown, the onset voltage for micro-pulse voltage wave forms is about 1 kV higher than for the RF sine waves discussed above.

Figure 16:
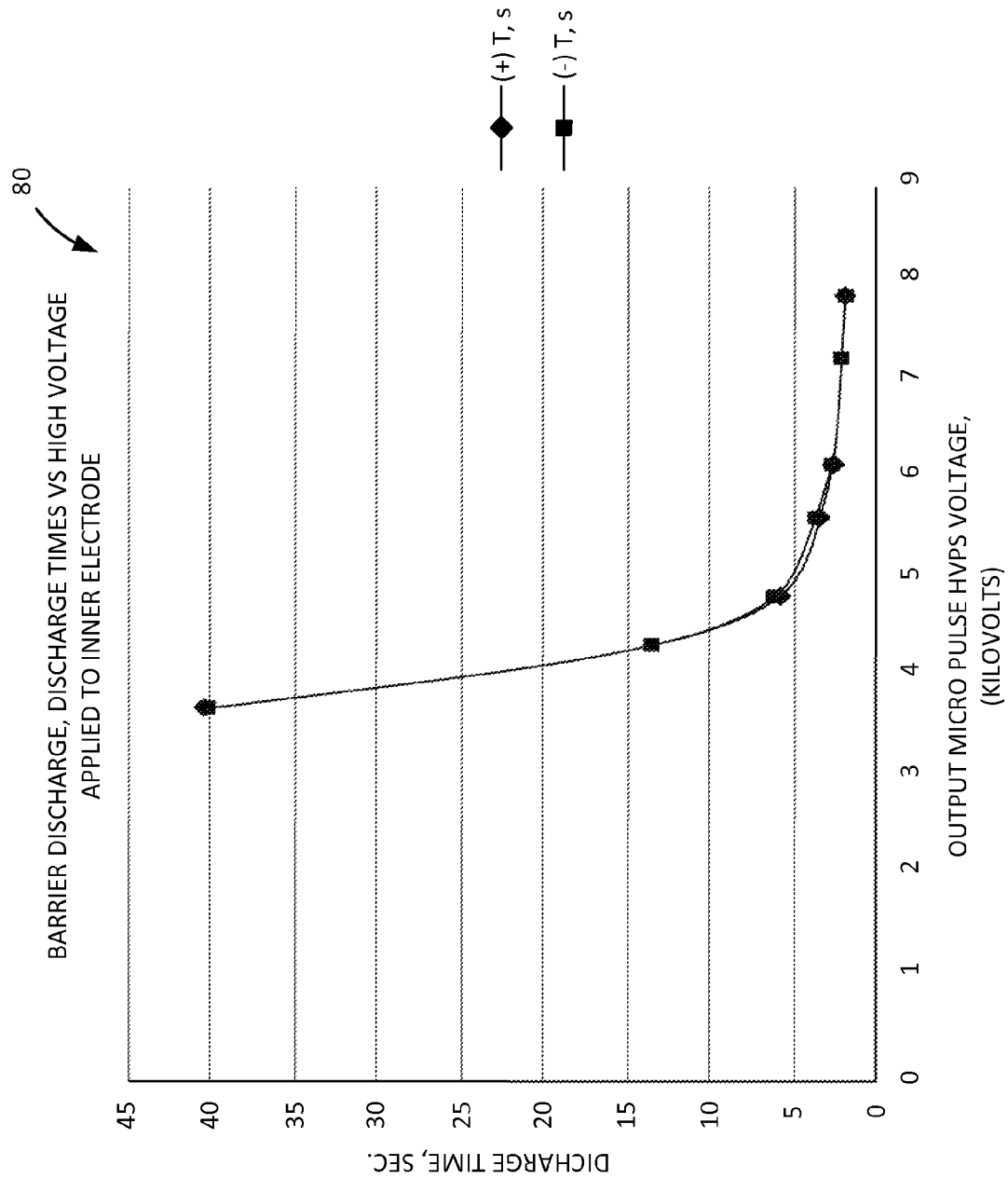

The chart 80 of FIG. 16 shows the relationship between measured discharge times and the amplitude of the micro-pulsed signal applied to inner emitter 44 during testing. As shown, discharge times rapidly decrease when the absolute value of the micro-pulsed voltages rise above the onset threshold by relatively low amounts. Further, while discharge times drop to less than 2.0 seconds at voltages between about 5-6 kV (absolute value), further increases in voltage amplitude (absolute value) applied to inner emitter 44 yield little further decrease in discharge time.

While the present invention has been described in connection with what is presently considered to be the most practical and preferred embodiments, it is to be understood that the invention is not limited to the disclosed embodiments, but is intended to encompass the various modifications and equivalent arrangements included within the spirit and scope of the appended claims. With respect to the above description, for example, it is to be realized that the optimum dimensional relationships for the parts of the invention, including variations in size, materials, shape, form, function and manner of operation, assembly and use, are deemed readily apparent to one skilled in the art, and all equivalent relationships to those illustrated in the drawings and described in the specification are intended to be encompassed by the appended claims. Therefore, the foregoing is considered to be an illustrative, not exhaustive, description of the principles of the present invention.

Other than in the operating examples or where otherwise indicated, all numbers or expressions referring to quantities of ingredients, reaction conditions, etc. used in the specification and claims are to be understood as modified in all instances by the term "about." Accordingly, unless indicated to the contrary, the numerical parameters set forth in the following specification and attached claims are approximations that can vary depending upon the desired properties, which the present invention desires to obtain. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical values, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between and including the recited minimum value of 1 and the recited maximum value of 10; that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

For purposes of the description hereinafter, the terms "upper", "lower", "right", "left", "vertical", "horizontal", "top", "bottom", and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

What is claimed is:

1. A balanced ionizer for static charge neutralization in a variable pressure environment in response to the application of variable-waveform signals thereto, the balanced ionizer comprising:
   a hollow dielectric channel having a length and an outer surface, the dielectric channel being at least partially disposed within the variable pressure environment;
   a reference emitter helically disposed along the length of and on the outer surface of the dielectric channel; and
   a high voltage electrode at least partially disposed within the hollow dielectric channel, the high voltage electrode presenting a high intensity electric field to the reference emitter through the dielectric channel in response to the provision of a variable-waveform high voltage signal dictated by conditions in the variable pressure environment, the electric field causing the generation of a plasma region with electrically balanced charge carriers within the variable pressure environment due to barrier discharge occurring at the interface of the reference emitter and the outer surface of the dielectric channel.

2. The ionizer of claim 1 wherein the channel is made of a ceramic material and wherein the reference emitter comprises a flat spiral band made of a conductive material.

3. The ionizer of claim 1 wherein the dielectric channel has an inner surface and wherein the high voltage electrode comprises a coil spring disposed on the inner surface of the dielectric channel.

4. The ionizer of claim 1 wherein the environment has a pressure, and wherein the amplitude of the variable-waveform high voltage signal is less than the breakdown voltage between the high voltage electrode and the reference emitter at the pressure of the environment.

5. The ionizer of claim 1 further comprising an environmental condition sensor for sensing at least one environmental condition within the variable pressure environment, and wherein the variable-waveform high-voltage signal depends at least in part on a change in an environmental condition sensed by the sensor.

6. The ionizer of claim 1 further comprising a status monitor circuit, the circuit cooperating with the reference emitter to produce a barrier discharge detection signal in response to barrier discharge occurring at the interface of the reference emitter and the outer surface of the dielectric channel.

7. A balanced ionizer for static charge neutralization in an enclosed variable pressure environment in response to the application of at least one variable-waveform signal thereto, the balanced ionizer comprising:
  a hollow dielectric channel having a length, an inner surface, an outer surface, one open end, and one opposing closed end, the dielectric channel being disposed within the variable pressure environment such that the open end of the dielectric channel is not within the variable pressure environment, and such that the opposing closed end is within the variable pressure environment;
  a reference emitter disposed within the variable pressure environment and along the length of and on the outer surface of the dielectric channel; and
  a high voltage electrode disposed within the hollow dielectric channel, the high voltage electrode presenting a high intensity electric field to the reference emitter through the dielectric channel in response to the provision of a variable-waveform high voltage signal dictated by conditions in the variable pressure environment, the electric field causing the generation of a plasma region with electrically balanced charge carriers within the variable pressure environment due to barrier discharge occurring at the interface of the reference emitter and the outer surface of the dielectric channel.

8. The ionizer of claim 7 wherein the channel is made of a ceramic material and wherein the reference emitter comprises a flat spiral band made of a conductive material disposed on the outer surface of the dielectric channel and within the variable pressure environment.

9. The ionizer of claim 7 wherein the high voltage electrode comprises a coil spring disposed on the inner surface of the dielectric channel and is not within the variable pressure environment.

10. The ionizer of claim 7 wherein the high voltage electrode comprises a conductive rod disposed within the hollow dielectric channel such that the high voltage electrode does not contact the inner surface of the dielectric channel and is not within the variable pressure environment.

11. The ionizer of claim 7 wherein the reference emitter comprises a wire mesh that surrounds the outer surface of the dielectric channel within the variable pressure environment.

12. The ionizer of claim 7 wherein the environment has a pressure, and wherein the amplitude of the variable-waveform high-voltage signal is less than the breakdown voltage between the high voltage electrode and the reference emitter at the pressure of the environment.

13. The ionizer of claim 7 further comprising an environmental condition sensor for sensing at least one environmental condition within the variable pressure environment, and wherein the variable-waveform high-voltage signal depends at least in part on a change in an environmental condition sensed by the sensor.

14. The ionizer of claim 7 further comprising a status monitor circuit, the circuit cooperating with the reference emitter to produce a barrier discharge detection signal in response to barrier discharge occurring at the interface of the reference emitter and the outer surface of the dielectric channel.

15. A balanced ionizing bar for static charge neutralization in a variable pressure environment in response to the application of variable-waveform signals thereto, the balanced ionizing bar comprising:
  an elongated chassis having a open faced hollow interior and a manifold with a gas inlet and plural apertures disposed between the manifold and the hollow interior such that gas entering the manifold inlet flows out of the open face of the hollow interior, the chassis being at least partially disposed within the variable pressure environment;
  a hollow dielectric channel having a length and an outer surface, the dielectric channel being disposed within the hollow interior of the elongated chassis;
  a reference emitter helically disposed along the length of and on the outer surface of the dielectric channel; and
  a high voltage electrode disposed within the hollow dielectric channel, the high voltage electrode presenting a high intensity electric field to the reference emitter through the dielectric channel in response to the provision of a variable-waveform high voltage signal dictated by conditions in the variable pressure environment, the electric field causing the generation of a plasma region with electrically balanced charge carriers within the variable pressure environment due to barrier discharge occurring at the interface of the reference emitter and the outer surface of the dielectric channel.

16. The ionizing bar of claim 15 wherein the dielectric channel is made of a ceramic material and wherein the reference emitter comprises a flat spiral band made of a conductive material.

17. The ionizing bar of claim 15 wherein the high voltage electrode comprises a conductive rod disposed within the hollow dielectric channel such that the high voltage electrode does not directly contact the dielectric channel.

18. The ionizing bar of claim 15 wherein the environment has a pressure, and wherein the amplitude of the variable-waveform high-voltage signal is less than the breakdown voltage between the high voltage electrode and the reference emitter at the pressure of the environment.

19. The ionizing bar of claim 15 further comprising an environmental condition sensor for sensing at least one environmental condition within the variable pressure environment, and wherein the variable-waveform high-voltage signal depends at least in part on a change in an environmental condition sensed by the sensor.

20. The ionizing bar of claim 15 further comprising a status monitor circuit, the circuit cooperating with the reference emitter to produce a barrier discharge detection signal in response to barrier discharge occurring at the interface of the reference emitter and the outer surface of the dielectric channel.

* * * * *